(12) United States Patent
Park et al.

(10) Patent No.: US 9,646,685 B2
(45) Date of Patent: May 9, 2017

(54) RESISTIVE MEMORY DEVICE, RESISTIVE MEMORY, AND OPERATING METHOD OF THE RESISTIVE MEMORY DEVICE

(71) Applicant: SAMSUNG ELECTRONICS CO., LTD., Suwon-si, Gyeonggi-do (KR)

(72) Inventors: Hyun-Kook Park, Anyang-si (KR); Yeong-Taek Lee, Seoul (KR); Dae-Seok Byeon, Seongnam-si (KR); Yong-Kyu Lee, Hwaseong-si (KR); Hyo-Jin Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/697,229

(22) Filed: Apr. 27, 2015

(65) Prior Publication Data
US 2016/0005463 A1 Jan. 7, 2016

(30) Foreign Application Priority Data
Jul. 7, 2014 (KR) .......................... 10-2014-0084618

(51) Int. Cl.
| | |
|---|---|
| *G11C 11/00* | (2006.01) |
| *G11C 13/00* | (2006.01) |
| *G11C 29/02* | (2006.01) |
| G11C 29/04 | (2006.01) |
| G11C 29/50 | (2006.01) |

(52) U.S. Cl.
CPC ...... *G11C 13/0021* (2013.01); *G11C 13/0002* (2013.01); *G11C 13/0033* (2013.01); *G11C 13/0035* (2013.01); *G11C 13/0038* (2013.01); *G11C 29/021* (2013.01); *G11C 29/028* (2013.01); *G11C 2029/0407* (2013.01); *G11C 2029/5006* (2013.01); *G11C 2213/71* (2013.01)

(58) Field of Classification Search
CPC ..................................................... G11C 11/00
USPC ............ 365/46, 94, 100, 129, 148, 158, 163
See application file for complete search history.

(56) References Cited

U.S. PATENT DOCUMENTS

| | | | |
|---|---|---|---|
| 6,754,102 | B2 | 6/2004 | Kleveland et al. |
| 7,245,526 | B2 | 7/2007 | Oh et al. |
| 7,248,494 | B2 | 7/2007 | Oh et al. |
| 7,417,887 | B2 | 8/2008 | Cho et al. |
| 7,573,748 | B2 | 8/2009 | Bedarida et al. |

(Continued)

FOREIGN PATENT DOCUMENTS

| | | |
|---|---|---|
| JP | 20110198445 | 10/2011 |
| KR | 20050045559 A | 6/2006 |

OTHER PUBLICATIONS

Tanakamaru, Shuhei et al., "Hybrid Storage of ReRAM/TLC NAND Flash with RAID-5/6 for Cloud Data Centers," ISSCC 2014 / Session 19 / Nonvolatile Memory Solutions / 19.6.

(Continued)

*Primary Examiner* — Harry W Byrne
(74) *Attorney, Agent, or Firm* — Volentine & Whitt, PLLC

(57) ABSTRACT

An operating method for a resistive memory device includes; applying a bias control voltage to a memory cell array of the resistive memory device, measuring leakage current that occurs in the memory cell array in response to the applied bias control voltage to generate a measuring result, generating a control signal based on the measuring result, and adjusting a level of the bias control voltage in response to the control signal.

13 Claims, 21 Drawing Sheets

(56) References Cited

U.S. PATENT DOCUMENTS

| | | | |
|---|---|---|---|
| 7,859,884 B2* | 12/2010 | Scheuerlein | G11C 13/0004 365/148 |
| 7,978,499 B2* | 7/2011 | Hosono | G11C 13/0004 365/148 |
| 8,331,177 B2 | 12/2012 | Sasaki | |
| 8,339,833 B2* | 12/2012 | Tokiwa | G11C 13/0069 365/148 |
| 8,526,258 B2 | 9/2013 | Kim et al. | |
| 2010/0085798 A1* | 4/2010 | Lu | G11C 11/56 365/148 |
| 2010/0091551 A1* | 4/2010 | Hosono | G11C 13/0004 365/148 |
| 2010/0238706 A1* | 9/2010 | Tokiwa | G11C 13/0069 365/148 |
| 2012/0314481 A1 | 12/2012 | Close et al. | |
| 2013/0223133 A1 | 8/2013 | Azuma et al. | |
| 2014/0153317 A1* | 6/2014 | Lu | G11C 11/56 365/148 |

OTHER PUBLICATIONS

Yu, Shimeng et al., "On the Stochastic Nature of Resistive Switching in Metal Oxide RRAM: Physical Modeling, Monte Carlo Simulation, and Experimental Characterization," 978-1-4577-0505-2/11 2011 IEEE IEDM11-413.

* cited by examiner

| Case 1 | $R_{reset}$ ↓ | $I_f$ ↑ | $V_{inhibit}$ ADJUSTMENT (for $I_f$ ↓) |
|---|---|---|---|
| Case 2 | $R_{set}$ ↑ | $I_f$ ↓ | $V_{inhibit}$ ADJUSTMENT (for $I_r$ ↓) |
| Case 3 | WEAR-OUT IN REVERSE DIRECTION | $I_r$ ↑↑ | $V_{inhibit}$ ADJUSTMENT (for $I_r$ ↓) |

| Mode | Case | $I_f$ | $I_r$ | $V_{inhibitx}$ | $V_{inhibity}$ |
|---|---|---|---|---|---|
| SET Write | 1 | ↑ | ↓ | ↑ | ↓ |
| | 2 | ↓ | ↑ | ↓ | ↑ |
| RESET Write | 1 | ↑ | – | – | – |
| | 2 | – | ↑↑ | ↓ | ↑ |
| READ | 1 | ↑ | – | – | ↓ |

RESISTIVE MEMORY DEVICE, RESISTIVE MEMORY, AND OPERATING METHOD OF THE RESISTIVE MEMORY DEVICE

CROSS-REFERENCE TO RELATED APPLICATIONS

This application claims the benefit of Korean Patent Application No. 10-2014-0084618 filed on Jul. 7, 2014, the subject matter of which is hereby incorporated by reference.

BACKGROUND

The inventive concept relates to resistive memory devices, and operating methods for resistive memory devices. More particularly, the inventive concept relates to resistive memory devices that manage leakage current, and operating methods for resistive memory devices that manage leakage current.

Continuing market demand for memory devices providing non-volatile data storage, higher data storage capacity, and lower power consumption has motivated research into certain next-generation memory devices. Ideally, next-generation memory devices would provide the high memory cell integration density of a Dynamic Random Access Memory (DRAM), the non-volatile data storage capabilities of a flash memory, and the data access speed of a static RAM (SRAM). Examples of next-generation memory devices currently under development include the Phase-change RAM (PRAM), Nano Floating Gate Memory (NFGM), Polymer RAM (PoRAM), Magnetic RAM (MRAM), Ferroelectric RAM (FeRAM), and Resistive RAM (RRAM).

SUMMARY

According to an aspect of the inventive concept, there is provided an operating method of a resistive memory device, the operating method including operations of providing at least one inhibit voltage to a memory cell array; measuring leakage current that occurs in the memory cell array based on the at least one inhibit voltage; feeding back a control signal generated based on a result of measuring; and adjusting a level of the at least one inhibit voltage, based on the control signal.

The operating method may further include an operation of storing information related to the adjusting of the level of the at least one inhibit voltage.

The operating method may further include an operation of entering a test mode or a power-up mode, wherein the leakage current is measured during the test mode or the power-up mode.

The operating method may further include an operation of receiving a request for a normal memory operation, wherein the leakage current is periodically or occasionally measured during the normal memory operation.

The operation of measuring may include operations of measuring a forward leakage current by using a measuring instrument connected to at least one first line of the memory cell array; and measuring a reverse leakage current by using a measuring instrument connected to at least one second line of the memory cell array.

The operation of feeding back may include an operation of generating the control signal according to an analysis of values of the forward leakage current and the reverse leakage current.

The control signal may be generated based on an analysis of increase and decrease patterns of the forward leakage current and the reverse leakage current.

According to the analysis of the increase and decrease patterns, the level of the at least one inhibit voltage may be adjusted to decrease one of the values of the forward leakage current and the reverse leakage current.

The control signal may be generated by accessing a lookup table including control information that corresponds to the forward leakage current and the reverse leakage current.

The operation of providing may include an operation of providing the memory cell array with a plurality of inhibit voltages having levels that are randomly set regardless of a normal memory operation.

The operation of providing may include an operation of providing the memory cell array with a plurality of inhibit voltages having levels that are set according to a memory operation.

The memory cell array may include a plurality of cell regions, and a unit of each of the plurality of cell regions may measure the leakage current, and, according to measurement results, a plurality of inhibit voltages having different levels may be provided to the plurality of cell regions, respectively.

The memory cell array may include a plurality of wordlines and a plurality of bitlines, and a level of at least one of a first inhibit voltage provided to the plurality of wordlines and a second inhibit voltage provided to the plurality of bitlines may be adjusted based on the control signal.

According to another aspect of the inventive concept, there is provided an operating method of a resistive memory device, the operating method including operations of providing a first voltage to a selected wordline and providing a first inhibit voltage to an non-selected wordline; providing a second voltage to a selected bitline and providing a second inhibit voltage to an non-selected bitline; measuring leakage current via at least one of a wordline and a bitline; and adjusting a level of at least one of the first and second inhibit voltages according to the measured leakage current.

According to another aspect of the inventive concept, there is provided a resistive memory device including a memory cell array including a plurality of first lines and a plurality of second lines; a power generator for generating one or more inhibit voltages that are provided to the memory cell array; and a measuring and analyzing unit which is connected to one or more lines, measures leakage currents that occur in the memory cell array, and, based on an analysis of the leakage currents, generates a control signal for adjusting levels of the one or more inhibit voltages.

According to another aspect of the inventive concept, there is provided a resistive memory system including a memory controller and a resistive memory device, wherein the memory controller includes a command output unit for outputting a command requesting a memory operation; a power adjuster for outputting control signals for adjusting levels of one or more voltages that are used in the resistive memory device; and a leakage current analyzing unit for receiving a leakage current measurement result from the resistive memory device, analyzing the leakage current measurement result, and generating an analysis result, wherein, according to the analysis result, the power adjuster outputs the control signals such that the control signals are different from each other.

BRIEF DESCRIPTION OF THE DRAWINGS

Certain embodiments of the inventive concept are illustrated in relevant part in the accompanying drawings in which.

DETAILED DESCRIPTION

Certain embodiments of the inventive concept will now be described in some additional detail with reference to the accompanying drawings. The inventive concept may, however, be embodied in many different forms, and should not be construed as being limited to only the illustrated embodiments. Thus, the inventive concept may include all revisions, equivalents, or substitutions which are included in the concept and the technical scope related to the present inventive concept. Throughout the written description and drawings, like reference numbers and labels are used to denote like or similar elements.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the inventive concept.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

Figure 1:
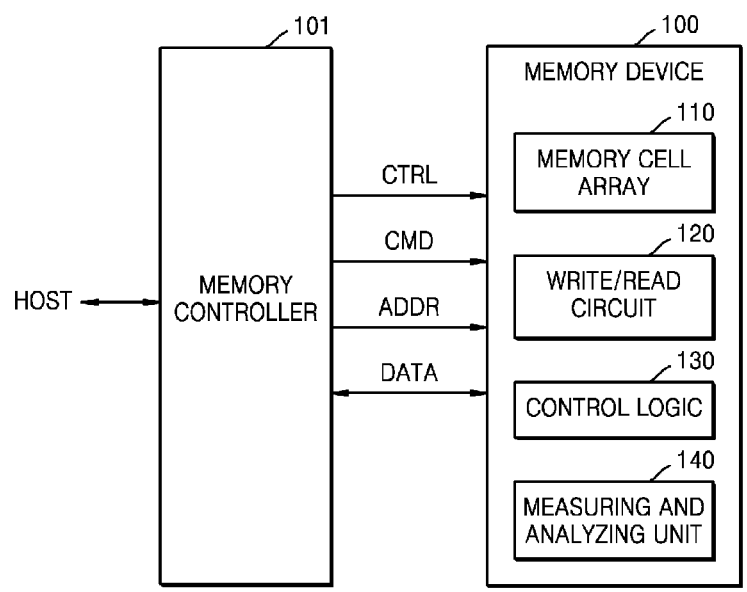
FIG. 1 is a block diagram of a memory system including a resistive memory device according to an embodiment of the inventive concept.

FIG. (FIG.) 1 is a block diagram of a resistive memory system 10 generally including a resistive memory device 100 and a memory controller 101. For the sake of brevity, the resistive memory device 100 will be referred to simply as the "memory device" 100, and in the illustrated embodiment of FIG. 1 includes a memory cell array 110 including resistive memory cells, a write/read circuit 120, control logic 130, and a measuring and analyzing unit 140.

In response to a read request received from a host, the memory controller 101 will control the operation of the memory device 100 to retrieve "read data" stored in selected resistive memory cells of the memory cell array 110. Similarly, in response to a write request received from the host, the memory controller 101 will control the operation of the memory device 100 to store "write data" in selected resistive memory cells of the memory cell array 110. To accomplish these two basic memory system operations, for example, the memory controller 101 provides at least one address ADDR, at least one command CMD, and one or more control signal(s) CTRL to the memory device 100. Here, write data and/or read data are collectively or singularly indicated in FIG. 1 as "DATA" being exchanged between the memory controller 101 and memory device 100.

The memory controller 101 may include a Random Access Memory (RAM), a processing unit, a host interface, and a memory interface, where the RAM may be used as an operating memory by the processing unit. The processing unit may control the internal operation of the memory controller 101. The host interface may be used to implement one or more data communication protocols that allow an exchange of data between the host and memory controller 101. For example, the memory controller 101 may communicate the host (or some other external source) using one or more conventionally understood data communication protocols, such as USB, MMC, PCI-E, ATA, Serial-ATA, Parallel-ATA, SCSI, ESDI, and IDE.

The memory cell array 110 include a plurality of resistive memory cells respectively disposed at regions where first signal lines and second signal lines cross. In the illustrated embodiments described hereafter, it is assumed that the first signal lines are bitlines and the second signal lines are wordlines.

The resistive memory cell of the memory cells array 110 may be configured to operate as a single-level cell (SLC) capable of storing one bit of data per memory cell, and/or as a multi-level cell (MLC) capable of storing two or more bits of data per memory cell. SLC operate in accordance with two resistance level distributions, while N-bit MLC operate in accordance with $2^N$ resistance level distributions.

The memory cell array 110 may be implemented as a two-dimensional (or horizontal) structure, or as a three-dimensional (or vertical) structure.

The memory cell array 110 may include resistance-type memory cells that include a variable resistor device (not shown) having a variable resistor. For one example, when resistance of the variable resistor device that is formed of a phase change material (e.g., Ge—Sb—Te) is changed according to a temperature, a resistive memory device may be a Phase change RAM (PRAM). For another example, when the variable resistor device is formed of complex metal oxide including an upper electrode, a lower electrode, and transition metal oxide there between, the resistive memory device may be a Resistive RAM (RRAM). For another example, when the variable resistor device is formed of an upper electrode of a magnetic material, a lower electrode of the magnetic material, and a dielectric there between, the resistive memory device may be a Magnetic RAM (MRAM).

The write/read circuit 120 performs write and read operations on the memory cells. The write/read circuit 120 may be connected to the memory cells via the bitlines, and may include write drivers that write data to the memory cells, and sense amplifiers that sense resistive components of the memory cells.

The control logic 130 may generally control the operations of the memory device 100, and may control the write/read circuit 120 so as to perform a memory operation such as a write operation or a read operation. For the write and read operations of the memory device 100, the control logic 130 may provide various pulse signals such as a write pulse, a read pulse, etc. to the write/read circuit 120, and in response to the various pulse signals, the write/read circuit 120 may provide a write current (or a write voltage) or a read current (or a read voltage) to the memory cell array 110. A pulse generator (not shown) that generates the various pulse signals may be arranged in or outside the control logic 130.

During a write operation directed to a memory cell of the memory device 100, a resistance value of a variable resistor of a memory cell of the memory cell array 110 may be increased or decreased depending on the value of the write data being written and the current resistance value of the variable resistor. For example, a memory cell of the memory cell array 110 may have a "current resistance value" already written to in accordance with previously written data, and the writing of a "new resistance value" associated with the write data may require an increase, a decrease, or no change at all to the current resistance value.

Write operations include reset write operations and set write operations. Here, in the context of resistive SLC, it is assumed that a "set state" for a resistive memory cell corresponds to a relatively low resistance value, while a "reset state" corresponds to a relatively high resistance value. Therefore, a reset write operation may be used to increase the resistance value of a variable resistor of the resistive memory cell, and a set write operation may be used to decrease the resistance value of the variable resistor of the resistive memory cell.

During write and read operations with respect to the resistive memory cells of the memory cell array 110, it is necessary to electrically separate "selected memory cells" and "non-selected memory cells". Such electrical separation (or designation) is usually accomplished by appropriately biasing wordlines and bitlines. For example, certain "selection voltage(s)" may be applied to wordline(s) and bitline(s) of selected memory cells, while certain "inhibit voltage(s)" may be applied to wordline(s) and bitline(s) of non-selected memory cells. Control information defining the nature of selection voltages and inhibit voltages may be preset and stored in the memory device 100.

Those skilled in the art will understand that memory operations (e.g., write and read operations) are performed in the memory device 100, so-called "leakage current" necessarily flows through one or more parts of the memory cell array 110. Leakage current in an undesirable loss of electrical charge from memory cell(s) that arises under normal memory system operating conditions (e.g., under the influence of applied control signals). However, while the existence of some leakage current is expected, embodiments of the inventive concept recognize that the nature and amount of leakage current may be advantageously managed by intelligently "optimizing" the nature (e.g., the level and/or duration) of various control signals applied to the memory cell array 110. For example, one or more selection voltages and/or one or more inhibit voltages applied to wordlines and/or bitlines may be optimized in its level (i.e., increased or decreased) on memory cell-by-memory cell basis, or on a memory cell group-by-memory cell groups basis. Hereafter, one or more selection voltage(s) (or selection currents) and/or one or more inhibit voltages (or inhibit currents) used to appropriately bias wordline(s) and/or bitlines(s) during a memory system operation will be referred to simply as "bias control voltages".

In the context of FIG. 1, the measuring and analyzing unit 140 may be used to measure leakage current occurring in some portion of the memory cell array 110, and may thereafter be used to analyze "measurement results" generated by this measuring of leakage current. One or more control signal(s) may be generated or derived by the measuring and analyzing unit 140 to adjust the level of bias control voltages. That is, one or more voltage (or current) generator(s) in the memory device 1100 may be used to selectively generate the bias control voltages required by memory system operations in response to one or more control signals provided by the measuring and analyzing unit 140 in view of actual leakage current for resistive memory cells of the memory cell array 110.

In addition to defining the nature of bias control voltages in view of leakage current, the nature of bias control voltages may be further defined in view of memory system operating mode. For example, certain memory systems according to embodiments of the inventive concept will be capable of operating in a test mode distinct from the normal operating mode (i.e., the mode in which write/read operations are performed). During the test mode for the memory device 100, various "test bias control voltages" may be provided to the memory cell array 110, and resulting leakage current measured and analyzed in order to define the nature of bias control voltages used during normal operation of the memory device 100.

In this context, the nature (e.g., the level) of the bias control voltages may be defined using the foregoing approach during a power-up period for the memory device 100.

In addition to an initial defining the bias control voltages during a test mode run during the power-up period, embodiments of the inventive concept may further define (or "adjust") the bias control voltages in real time during the normal operating mode. For example, at certain times during normal operation (e.g., times occurring at set intervals, or times triggered by detected read data degradation, etc.), the measurement and analysis of leakage current may be performed, and bias control voltages adjusted as necessary in response to the measuring and analyzing. Such "bias control voltage adjustment times", wherein measurement and analysis of leakage current is performed and bias control voltages are adjusted, as necessary, in response to the measuring and analyzing of leakage current may be controlled by a counted number of read/write cycles, for example.

The initiation of one or more bias control voltage adjustment times may be made in response to the output of a temperature sensor disposed in (or in relation to) the memory device 100. Thus, upon determining that some monitored internal temperature has exceeded a predetermined threshold, the measurement and analysis of leakage current may be performed. The initiation of one or more bias control voltage adjustment times may be made in response to a memory cell "wear" determination. It is common in certain nonvolatile memory systems to track the wear state of memory cells in a memory cell array. The wear state of resistive memory cells may be indicated in certain embodiments by a number of error bits detected in read data retrieved from memory cells. That is, once a number of detected error bits exceeds a reference value, the measurement and analysis of the leakage current may be performed.

Any one or more "initiating event" (e.g., wear state detection, temperature condition, operation cycle count, bit error detection, etc.) may be used to trigger—during normal operation of the resistive memory system 10—the measurement and analysis of leakage current for a constituent memory cell array, along with potentially, a corresponding readjustment of bias control voltages. However initiated, the real-time adjustment of bias control voltages in response to the measurement and analysis of the leakage current allows excellent control over the management (e.g., the minimization) of power consumption.

It is worth nothing that leakage current characteristics for the memory cell array 110 will vary by design and operating conditions. For example, the particular characteristics of a variable resistor element of a resistive memory cell in view of particular selecting circuits arranged in relation to the memory cells, may exhibit different leakage current characteristics in the memory cell array 110 at different times and under varying conditions. Here, as the level of certain bias control voltages (e.g., inhibit voltages) applied to resistive memory cells varies, the forward and/or reverse leakage currents flowing through the resistive memory cells and used to define the resistance value of constituent variable resistors of the memory cells, will also vary. The resulting leakage current may be analyzed and optimized according to leakage current and other memory system performance characteristics.

In various embodiments of the inventive concept, the memory controller 101 and memory device 100 may be commonly integrated in a semiconductor device, such as a memory card. For example, the memory controller 101 and memory device 100 may be commonly integrated and configured for operation as a PC card, PCMCIA card, compact flash (CF) card, smart media card (SM/SMC), memory stick, multimedia card (MMC, RS-MMC, or MMC-micro), SD card (miniSD or microSD), or universal flash storage (UFS). In other embodiments of the inventive concept, the memory controller 101 and memory device 100 may be commonly integrated and configured for operation as a Solid State Disk/Drive (SSD).

Exemplary operation of the memory device 100 included in the resistive memory system 10 with be described hereafter.

Figure 2:
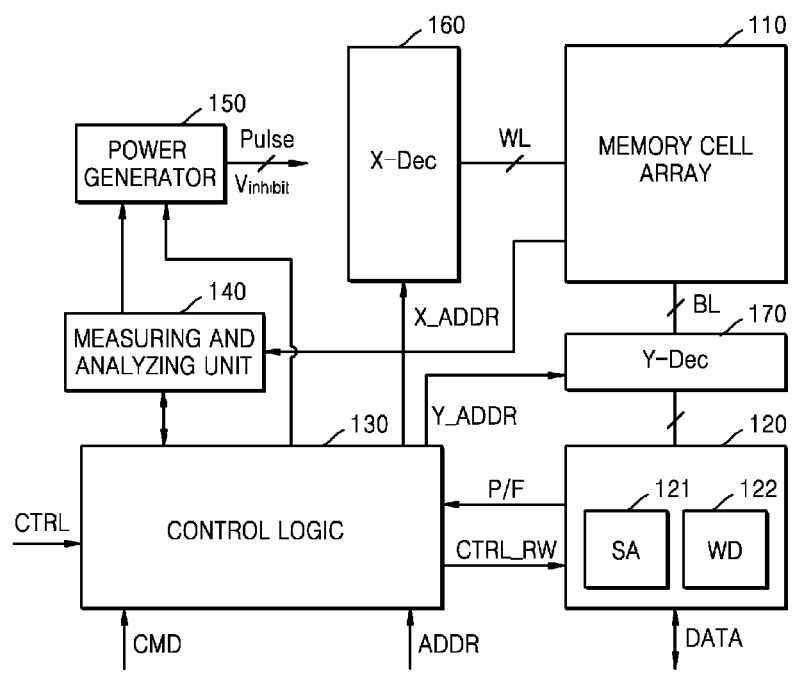
FIG. 2 is a block diagram of the memory device of FIG. 1 according to an embodiment of the inventive concept.

FIG. 2 is a block diagram further illustrating in one example the memory device 100 of FIG. 1 according to an embodiment of the inventive concept.

Referring to FIG. 2, the memory device 100 includes in addition to the memory cell array 110, write/read circuit 120, control logic 130 and measuring and analyzing unit 140, a power generator 150, a row decoder 160, and a column decoder 170. The write/read circuit 120 is further illustrated in FIG. 2 as including a sense amplifier 121 and a write driver 122.

Memory cells arranged in the memory cell array 110 are connected to bitlines BL and wordlines WL. Since various bias control voltages (whether specifically applied as voltages or currents) are provided via the bitlines BL and wordlines WL to selected and non-selected memory cells in order to write date to or read data from the selected memory cells.

An address ADDR associated with a command CMD is provide and indicates selected (e.g., access-targeted) memory cells. The address ADDR may include a row address X_ADDR selecting wordlines WL of the memory cell array 110, and a column address Y_ADDR selecting bitlines BL of the memory cell array 110. The row decoder 160 performs a wordline selecting operation in response to the row address X_ADDR, and the column decoder 170 performs a bitline selecting operation in response to the column address Y_ADDR.

The write/read circuit 120 is connected to bitlines BL and thus may write data to a selected memory cell, or may read data from a selected memory cell. For example, the write/read circuit 120 may receive a write pulse from the power generator 150, and the write driver 122 may provide a write voltage or a write current to the memory cell array 110 via the column decoder 170 according to the received write pulse. During a set write operation, the write driver 122 may provide a set current or a set voltage to the memory cell array 110 in response to a set pulse, and thus may decrease a resistance value of a variable resistor of the memory cell. During a reset write operation, the write driver 122 may provide a reset current or a reset voltage to the memory cell array 110, in response to a reset pulse, and thus may increase the resistance value of the variable resistor of the memory cell.

During a read operation, the write/read circuit 120 may generate and provide a read current (or a read voltage) for the read operation to the memory cell. The sense amplifier 121 may include a current generator (or a voltage generator), and in order to determine the data, the sense amplifier 121 may include a comparator that is connected to a node (e.g., a sensing node) of the bitlines BL. Since one end of the comparator is connected to the sensing node, and the other end is connected to a reference voltage, the sense amplifier 121 may determine a value of the data.

Here, the write/read circuit 120 may provide the control logic 130 with a pass/fail signal P/F according to a result of the determination on the read data. The control logic 130 may refer to the pass/fail signal P/F and thus may control write and read operations of the memory cell array 110.

The control logic 130 may output various control signals CTRL_RW for writing data to the memory cell array 110 or reading data from the memory cell array 110, based on a command CMD, an address ADDR, and a control signal CTRL received from the memory controller 101. By doing so, the control logic 130 may generally control operations in the memory device 100.

Recognizing that various inhibit voltages are one important type of bias control voltage, certain embodiments of the inventive concept will now be described that specifically adjust one or more inhibit voltage(s) in response to the measurement and analysis of leakage current, as periodically performed in view of memory system operating mode, memory system operating conditions, etc. Thus, when a selected memory cell of the memory cell array 110 is accessed (i.e., written to or read from), an inhibit voltage (Vinhibit) will be applied to wordlines WL and/or bitlines BL connected to non-selected memory cells. Although the inhibit voltage is thus applied, leakage current will occur in non-selected memory cells of the memory cell array 110. As described above, the amount (or level) of leakage current associated with non-selected memory cells will vary according to operating characteristics and operating conditions for the memory device 100. For example, in accordance with the operating characteristics of a memory cell resistance element and its selecting device (e.g., a diode, etc.) within each resistive memory cells, the level of leakage current will vary with operating conditions, such as temperature of the memory device 100, wear state for the memory cells, etc.

The measuring and analyzing unit 140 is connected to the wordlines WL and/or bitlines BL of the memory cell array 110 in order to measure leakage current associated with some part of the memory cell array 110, and analyse the measurement results. In response to this measurement and analysis, the measuring and analyzing unit 140 will provide the power generator 150 with one or more control signal(s) that adjust the nature (e.g., the level) of the inhibit voltage. Alternatively, the measuring and analyzing unit 140 may provide the result of the analysis of leakage current to the control logic 130, and then the control logic 130 may generate a control signal adjusting the level of the inhibit voltage.

The measurement and analysis of the leakage current may be variously performed. For example, according to different levels of the inhibit voltage (Vinhibit), a forward leakage current may occur in some memory cells, and a reverse leakage current may occur in other memory cells. In the measurement of leakage current, the measuring and analyzing unit 140 may measure one or both of forward and reverse leakage current.

In the analysis of the leakage current, an increase/decrease in forward leakage, and/or an increase/decrease in reverse leakage current may be analysed. For example, according to the analysis results of increase/decrease patterns for forward and/or reverse leakage current, the level of the inhibit voltage may be adjusted. That is, the measuring and analyzing unit 140 may analyse whether the forward leakage current has increased or the reverse leakage current has increased under a particular bias condition, and may thereafter adjust the level of the inhibit voltage so as to decrease one of the forward leakage current and reverse leakage current.

For the measurement and analysis of the leakage current, various bias control voltages may be provided to the memory cell array 110. For example, the memory cell array 110 may receive inhibit voltages that are randomly set regardless of biasing condition associated with a particular memory operation (e.g., a write operation or a read operation). Alternatively, a set voltage or a reset voltage may be applied together with other bias control voltages during certain memory operations to selected memory cells, while one or more inhibit voltages may be provided to non-selected memory cells. That is, when measurement and analysis are performed during normal memory operations (i.e., during the normal operating mode of the memory device 100), a set voltage or a reset voltage as well as various inhibit voltages will be provided to the memory cell array 110. And in view of leakage current measured in relation to a specific set of bias control voltages, the level(s) of the inhibit voltage(s) (Vinhibit) may be adjusted.

Figure 3:
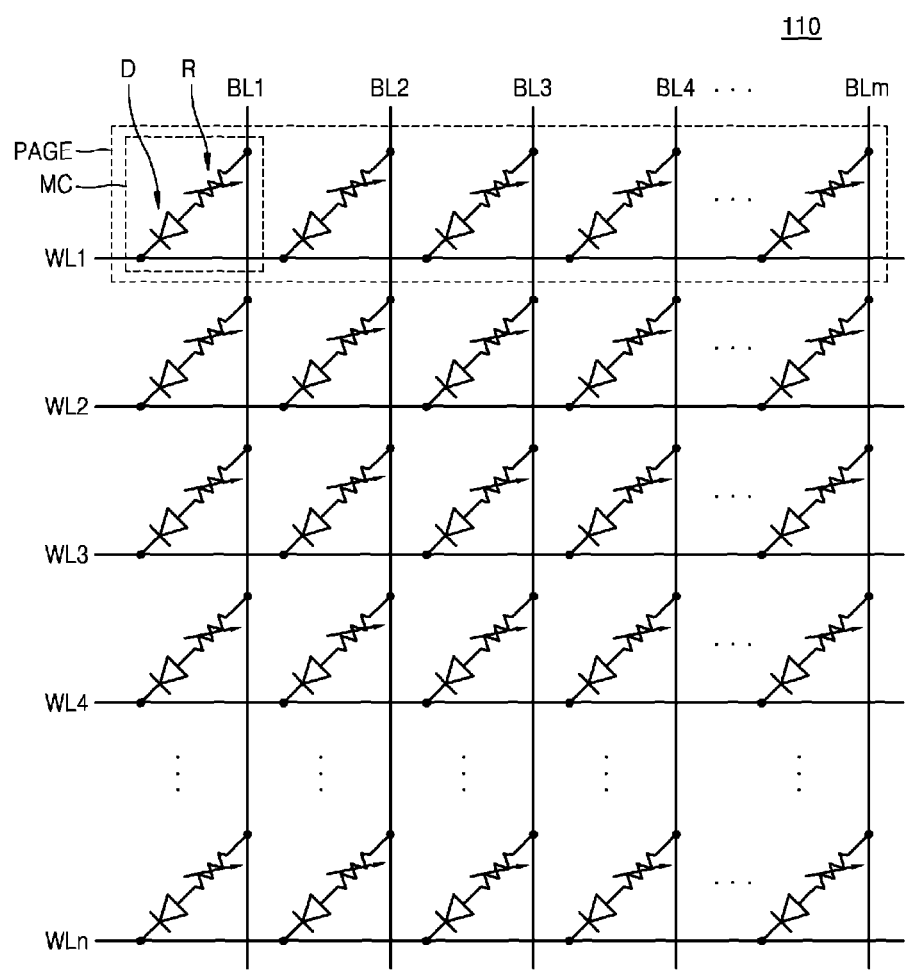
FIG. 3 is a circuit diagram illustrating an example of a memory cell array of FIG. 2.

FIG. 3 is a circuit diagram illustrating an example of the memory cell array 110 of FIG. 2. The memory cell array 110 may include a plurality of cell blocks, and FIG. 3 shows one cell block.

Referring to FIG. 3, the memory cell array 110 may include a plurality of wordlines WL1 through WLn, a plurality of bitlines BL1 through BLm, and a plurality of memory cells MC. Here, the number of the wordlines WL, the number of the bitlines BL, and the number of the memory cells MC may vary according to one or more embodiments. Also, the memory cells MC that are selected by one wordline may be defined by a page unit PAGE.

Each of the plurality of memory cells MC may include a variable resistor R and a selection device D. Here, the variable resistor R may be referred to as a variable resistor device or a variable resistor material, and the selection device D may be referred to as a switching device. The variable resistor R may be connected between one of the bitlines BL1 through BLm and the selection device D, and the selection device D may be connected between the variable resistor device R and one of the wordlines WL1 through WLn. However, one or more embodiments of the inventive concept are not limited thereto, and the selection device D may be connected between one of the bitlines BL1 through BLm and the variable resistor R, and the variable resistor R may be connected between the selection device D and one of the wordlines WL1 through WLn.

The variable resistor R may be changed to one of a plurality of resistive states, in response to an electric pulse applied thereto. The variable resistor R may include a phase-change material whose crystal state is changed according to a current. The phase-change material may include various materials GaSb, InSb, InSe, or Sb2Te3 obtained by compounding two elements, GeSbTe, GaSeTe, InSbTe, SnSb2Te4, or InSbGe obtained by compounding three elements, or AgInSbTe, (GeSn)SbTe, GeSb(SeTe), Te81Ge15Sb2S2 obtained by compounding four elements.

The phase-change material may have an amorphous state that is relatively resistive, and a crystal state that is relatively low-resistive. A phase of the phase-change material may be changed by a Joule's heat that is generated by the current. By using the change of the phase, data may be written.

Alternately, the variable resistor R may not include the phase-change material, but instead may include one or more perovskite compounds, transition metal oxide, magnetic materials, ferromagnetic materials, or antiferromagnetic materials.

The selection device D may be connected between one of the wordlines WL1 through WLm and the variable resistor R, and according to a voltage applied to the connected wordline and bitline, a current that is supplied to the variable resistor R may be controlled. In the present embodiment, the selection device D may be a PN-junction diode or a PIN-junction diode, and an anode of a diode may be connected to the variable resistor R, and a cathode of the diode may be connected to one of the wordlines WL1 through WLm. Here, when a voltage difference between the anode and the cathode of the diode is greater than a threshold voltage of the diode, the diode is turned on so that the current may be supplied to the variable resistor R.

As illustrated in FIG. 3, when a diode is used as the selection device D, in order to distinguish between a selected memory cell and a non-selected memory cell, a sharp difference between currents that is caused by a difference between electric potentials that are applied to ends of an anode and a cathode of the diode is used. As described above, according to various reasons, the leakage current may occur in the memory cell array 110 or a level of the leakage current may be changed. For example, the leakage current may be changed according to characteristics of the variable resistor R and the selection device D.

Figure 4A:
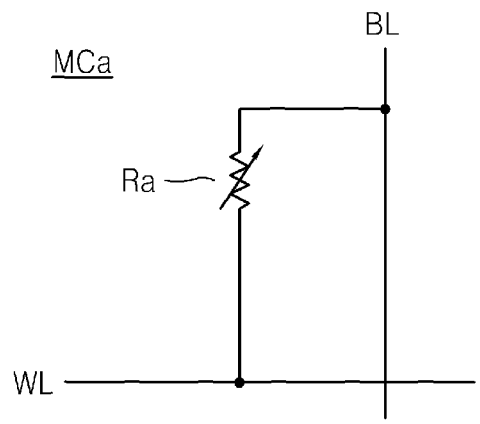
FIGS. 4A through 4C are circuit diagrams of modified examples of a memory cell of FIG. 3.
Figure 4B:
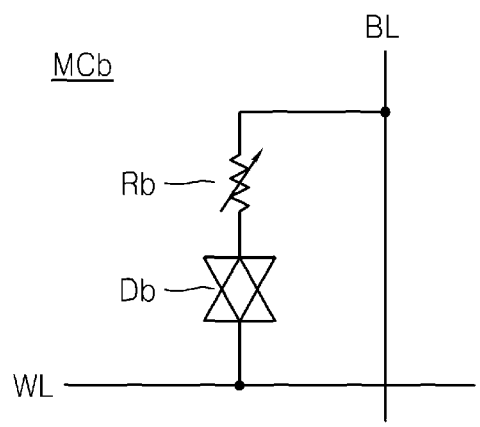
Figure 4C:
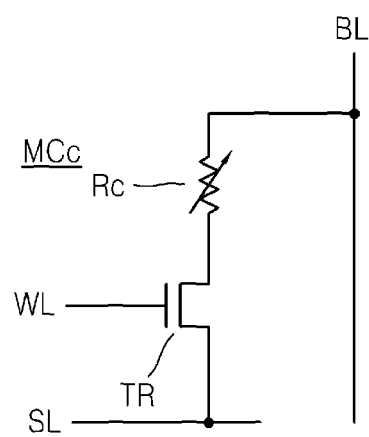

FIGS. 4A, 4B and 4C are circuit diagrams illustrating possible modifications to the memory cell MC of FIG. 3.

Referring to FIG. 4A, a memory cell MCa may include a variable resistor Ra that may be connected between a bitline BL and a wordline WL. The memory cell MCa may store data due to voltages that are applied to the bitline BL and the wordline WL, respectively.

Referring to FIG. 4B, a memory cell MCb may include a variable resistor Rb and a bidirectional diode Db. The variable resistor Rb may include a resistive material so as to store data. The bidirectional diode Db may be connected between the variable resistor Rb and a wordline WL, and the variable resistor Rb may be connected between a bitline BL and the bidirectional diode Db. Positions of the bidirectional diode Db and the variable resistor Rb may be changed with respect to each other. By using the bidirectional diode Db, a leakage current that may flow a non-selected resistor cell may be cut.

Referring to FIG. 4C, a memory cell MCc may include a variable resistor Rc and a transistor TR. The transistor TR may be a selection device, i.e., a switching device that supplies or cuts a current to the variable resistor Rc, according to a voltage of a wordline WL. In the embodiment of FIG. 4C, in addition to the wordline WL, a source line SL may be additionally arranged to adjust voltage levels at both ends of the variable resistor Rc. The transistor TR may be connected between the variable resistor Rc and the source line SL, and the variable resistor R may be connected between a bitline BL and the transistor TR. Positions of the transistor TR and the variable resistor Rc may be changed with respect to each other. The memory cell MCc may be selected or may not be selected, according to ON or OFF of the transistor TR that is driven by the wordline WL.

Figure 5A:
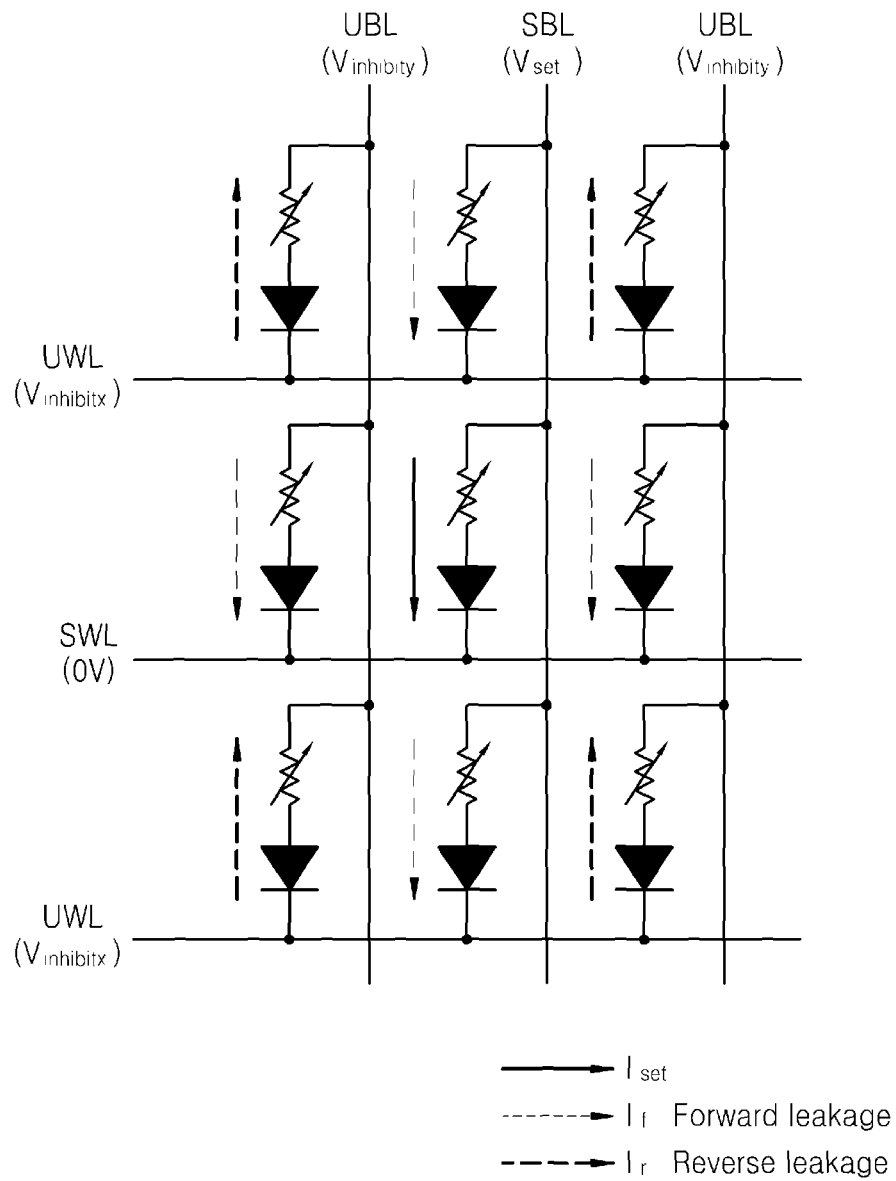
FIGS. 5A and 5B are circuit diagrams illustrating examples of a leakage current that may occur during a data write operation.
Figure 5B:
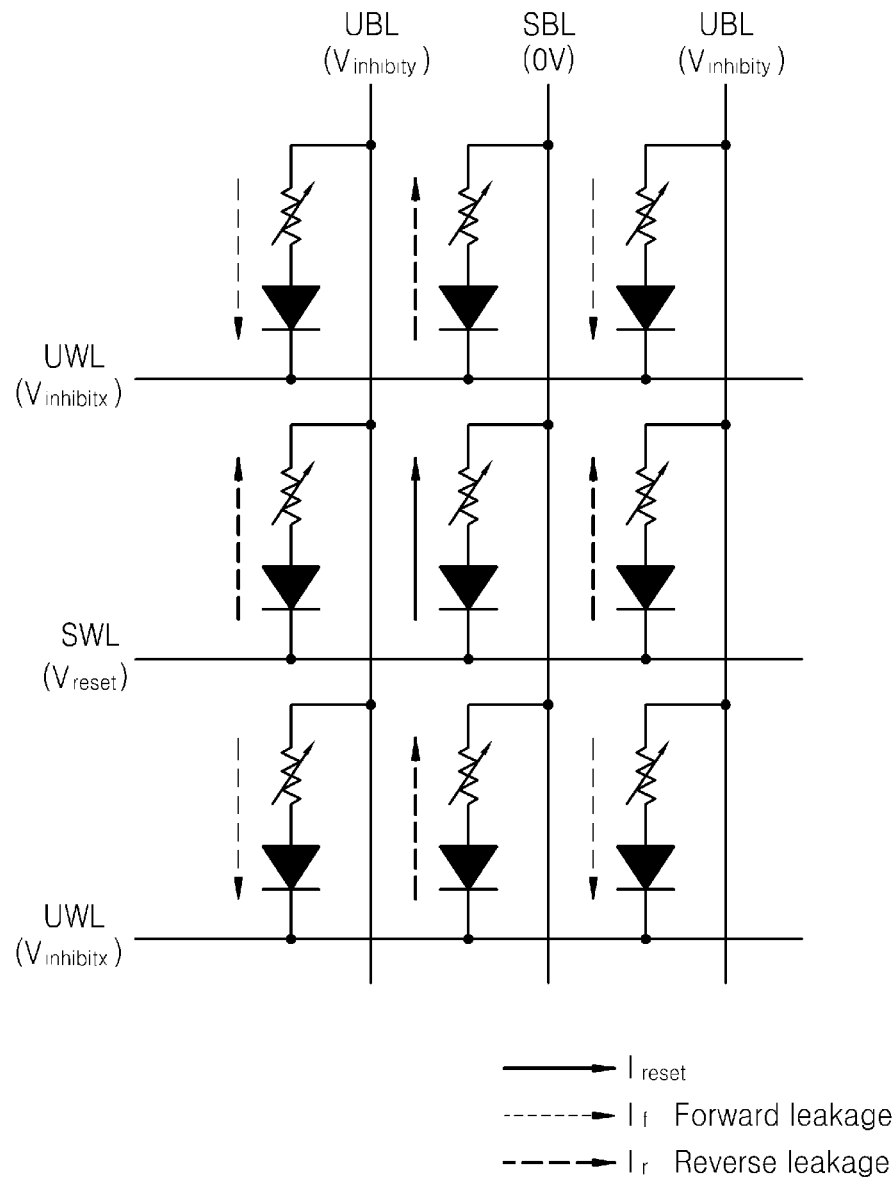

FIGS. 5A and 5B are circuit diagrams illustrating examples of a leakage current that may occur during a write operation. FIG. 5A illustrates an example wherein leakage current occurs during a set write operation, and FIG. 5B illustrates an example wherein leakage current occurs during a reset write operation.

As illustrated in FIG. 5A, during a set write operation (SET Write) in which a resistance value of a variable resistor of a selected memory cell is decreased, a relatively low voltage, e.g., 0V, may be applied to a wordline (hereinafter, the selected wordline SWL) that is connected to the selected memory cell, and a set voltage $V_{set}$ may be applied to a bitline (hereinafter, the selected bitline SBL) that is connected to the selected memory cell. Also, a first inhibit voltage $V_{inhibitx}$ may be provided to a wordline (hereinafter, the non-selected wordline UWL), other than the selected wordline SWL, and a second inhibit voltage $V_{inhibity}$ may be provided to a non-selected bitline UBL, other than the selected bitline SBL. A level of the first inhibit voltage $V_{inhibitx}$ and a level of the second inhibit voltage $V_{inhibity}$ may be equal to each other or may be different from each other. In the example of FIG. 5A, the level of the first inhibit voltage $V_{inhibitx}$ is greater than the level of the second inhibit voltage $V_{inhibity}$.

As illustrated in FIG. 5A, according to the set voltage $V_{set}$ and the levels of the first inhibit voltage $V_{inhibitx}$ and the second inhibit voltage $V_{inhibity}$, a difference between voltages of both ends of a non-selected memory cell is generated, so that a forward leakage current $I_f$ may occur in some memory cells, and a reverse leakage current $I_r$ may occur in other memory cells. For example, the reverse leakage current $I_r$ may occur in non-selected memory cells that are connected to the non-selected wordline UWL to which the first inhibit voltage $V_{inhibitx}$ is applied, and that are connected to the non-selected bitline UBL to which the second inhibit voltage $V_{inhibity}$ is applied. Also, the forward leakage current $I_f$ may occur in non-selected memory cells that are connected to the selected bitline SBL to which the set voltage $V_{set}$ is be applied. In addition, the forward leakage current $I_f$ may occur in non-selected memory cells that are connected to the selected wordline SWL.

As illustrated in FIG. 5B, during a reset write operation (RESET Write) in which a resistance value of a variable resistor of a selected memory cell is increased, a reset voltage $V_{reset}$ may be applied to a wordline (hereinafter, the selected wordline SWL) that is connected to the selected memory cell, and a relatively low voltage, e.g., 0V, may be applied to a bitline (hereinafter, the selected bitline SBL) that is connected to the selected memory cell. Also, a first inhibit voltage $V_{inhibitx}$ may be provided to a wordline (hereinafter, the non-selected wordline UWL), other than the selected wordline SWL, and a second inhibit voltage $V_{inhibity}$ may be provided to a non-selected bitline UBL, other than the selected bitline SBL. In a biasing condition of the reset write operation RESET Write, a level of the second inhibit voltage $V_{inhibity}$ may be greater than a level of the first inhibit voltage $V_{inhibitx}$, and according to the biasing condition, a forward leakage current $I_f$ may occur in some memory cells, and a reverse leakage current $I_r$ may occur in other memory cells.

Figure 6:
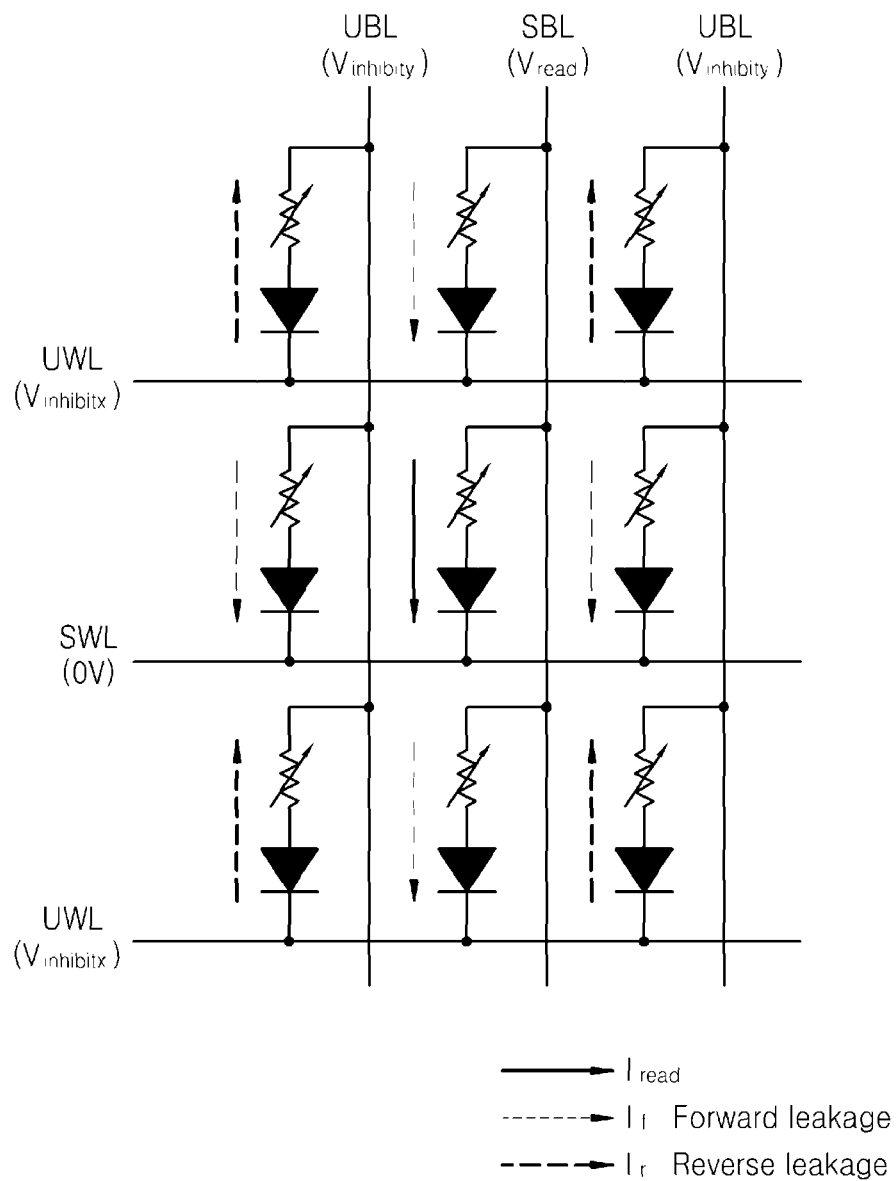
FIG. 6 is a circuit diagram illustrating an example of a leakage current that may occur during a data read operation.

FIG. 6 is a circuit diagram illustrating an example of leakage current that may occur during a read operation.

As illustrated in FIG. 6, in order to read data of a selected memory cell, 0V may be applied to a selected word line SWL, and a read voltage $V_{read}$ may be applied to a selected bitline SBL. A first inhibit voltage $V_{inhibitx}$ may be provided to a non-selected wordline UWL, and a second inhibit voltage $V_{inhibity}$ may be provided to a non-selected bitline UBL. In a biasing condition of the data read operation, a level of the first inhibit voltage $V_{inhibitx}$ may be greater than a level of the second inhibit voltage $V_{inhibity}$, and according to the biasing condition, a forward leakage current $I_f$ may occur in some memory cells, and a reverse leakage current $I_r$ may occur in other memory cells.

While FIGS. 5A, 5B, and 6 illustrate write/read operations for a bipolar-type memory device, embodiments of the inventive concept are not limited thereto. For example, the measurement and analysis of the leakage current according to certain embodiments of the inventive concept may be applied to a unipolar-type memory device, and in this case, the unipolar-type memory device may adjust a level of an inhibit voltage by measuring and analyzing a forward leakage current.

Figure 7:
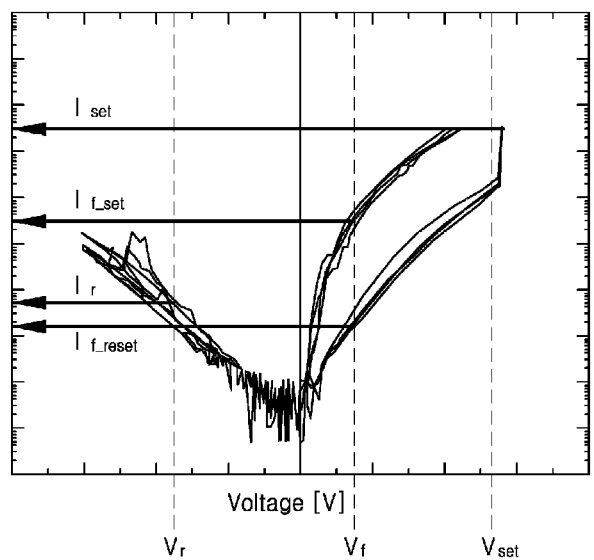
FIG. 7 is a graph of current-voltage characteristics of a leakage current.

FIG. 7 is a graph illustrating current-voltage characteristics of leakage current.

As in the graph of the current-voltage characteristics of a resistive memory cell shown in FIG. 7, the current-voltage characteristics are asymmetrical in a forward direction and a reverse direction, and thus the leakage current that flows in the resistive memory cell may vary according to a level and direction of a biasing voltage. For example, a forward leakage current $I_f$ may occur in non-selected memory cells in which a voltage difference between both ends corresponds to $V_f$ (e.g., a voltage difference that corresponds to a first polarity), and forward leakage currents $I_{f\_set}$ and $I_{f\_reset}$ having different levels may occur in the non-selected memory cells according to a program state (or, a set state or a reset state) of each of the non-selected memory cells. Similarly, a reverse leakage current $I_r$ may occur in non-selected memory cells in which a voltage difference between both ends corresponds to $V_r$ (e.g., a voltage difference that corresponds to a second polarity), and reverse leakage currents $I_r$ having different levels may occur in the non-selected memory cells according to a program state (or, a set state or a reset state) of each of the non-selected memory cells. In the graph of FIG. 7, the levels of the reverse leakage currents $I_r$ that occur in memory cells of different program states have similar values.

Figure 8:
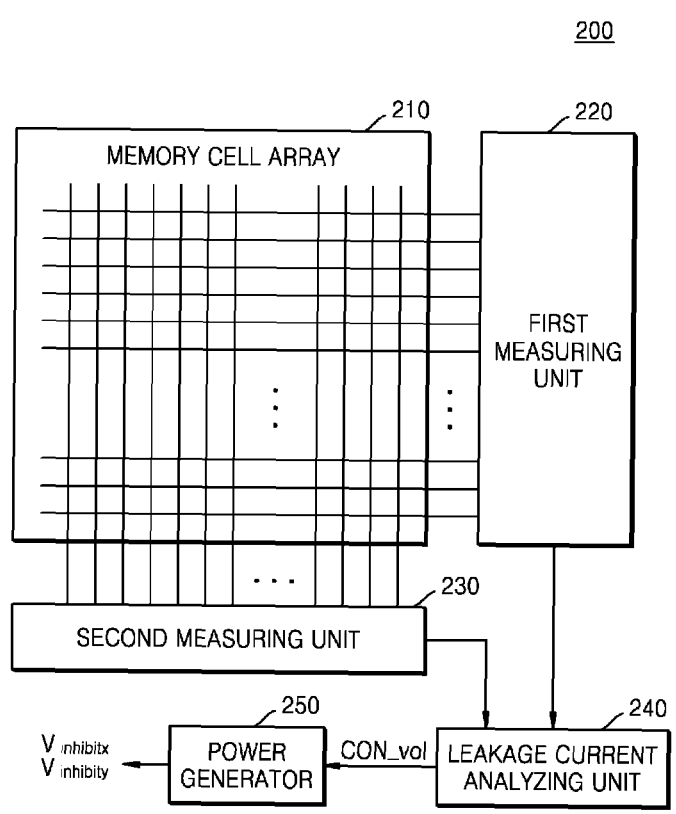
FIG. 8 is a block diagram of a memory device including measuring and analyzing units according to another embodiment of the inventive concept.

FIG. 8 is a block diagram of a memory device 200 including measuring and analyzing units according to another embodiment of the inventive concept.

As illustrated in FIG. 8, the memory device 200 comprises a memory cell array 210, a first measuring unit 220, a second measuring unit 230, a leakage current analyzing unit 240, and a power generator 250. Although not shown in FIG. 8, the peripheral circuits such as the write/read circuit 120, control logic 130, etc. described in relation to the memory device 100 of FIG. 2 may also be included in the memory device 200.

The first measuring unit 220, second measuring unit 230, and leakage current analyzing unit 240 of FIG. 8 may operate in combination to functionally implement the measuring and analyzing unit 140 of FIG. 2. The first measuring unit 220 may be connected to one or more wordlines of the memory cell array 210 and thus may measure a leakage current via the one or more wordlines. Also, the second measuring unit 230 may be connected to one or more bitlines of the memory cell array 210 and thus may measure a leakage current via the one or more bitlines. The measurement results from the first measuring unit 220 and the second measuring unit 230 may be provided to the leakage current analyzing unit 240. Although FIG. 8 illustrates the first measuring unit 220 and the second measuring unit 230, only one of the first measuring unit 220 and the second measuring unit 230 may be arranged to measure a leakage current.

The first measuring unit 220 may measure a forward leakage current and/or a reverse leakage current via the wordlines. Also, the first measuring unit 220 may include a plurality of measuring instruments that are connected to at least some wordlines of the memory cell array 210. Similarly, the second measuring unit 230 may include a plurality of measuring instruments that are connected to at least some bitlines of the memory cell array 210.

Hereinafter, measurement and analysis of a leakage current are described below with reference to a measuring operation of the first measuring unit 220. The first measuring unit 220 may include the measuring instruments. Since the measuring instruments are connected to different wordlines, respectively, the first measuring unit 220 may measure a leakage current via each of the wordlines. When the first measuring unit 220 includes first and second measuring instruments, according to a biasing state with respect to the memory cell array 210, the first measuring instrument may measure a forward leakage current, and the second measuring instrument may measure a reverse leakage current. Alternatively, according to a biasing state with respect to the memory cell array 210, all of the first and second measuring instruments may measure forward leakage currents or reverse leakage currents.

The first measuring unit 220 may variously provide a measurement result of the leakage current to the leakage current analyzing unit 240. For example, the first measuring unit 220 may provide respective measurement results of respective forward leakage currents via the wordlines to the leakage current analyzing unit 240, or may sum up the forward leakage currents and may provide a total sum result to the leakage current analyzing unit 240. Similarly, the first measuring unit 220 may provide respective measurement results of respective reverse leakage currents via the wordlines to the leakage current analyzing unit 240, or may sum up the reverse leakage currents and may provide a total sum result to the leakage current analyzing unit 240. The measurement results may be generated as various signals, e.g., an analog signal according to a level of the leakage current may be provided as the measurement result, or a measured value of the leakage current may be converted to a digital signal and then the digital signal may be provided as the measurement result.

The leakage current analyzing unit 240 analyses the measurement result for the leakage current, and thus may provide a control signal (CON_vol) based on a result of the analysis to the power generator 250. The control signal may be used to adjust levels of various inhibit voltages and may have control information for increasing or decreasing the levels of the various inhibit voltages according to the measurement results of the forward leakage currents and/or the reverse leakage currents. For example, the leakage current analyzing unit 240 may include a storage unit capable of storing the control information corresponding to the measurement results of the leakage currents the form of one or more table(s). That is, the leakage current analyzing unit 240 may receive the measurement results, may refer to the tabular control information in order to generate the control signal (CON_vol).

The power generator 250 may adjust levels of a first inhibit voltage $V_{inhibitx}$ and a second inhibit voltage $V_{inhibity}$, in response to the control signal. Since the first inhibit voltage $V_{inhibitx}$ and the second inhibit voltage $V_{inhibity}$ having adjusted levels are provided to the memory cell array 210, a more optimal leakage current may be obtained for the memory cell array 210. That is, the control signal (CON_vol) corresponding to the measured leakage current is fed back to the power generator 250, such that the leakage current flowing in the memory cell array 210 is decreased according to the first inhibit voltage $V_{inhibitx}$ and second inhibit voltage $V_{inhibity}$ having appropriately adjusted levels, such that a "leakage current compensating operation" is effectively performed.

According to the leakage current compensating operation, the overall current consumed by operation of the memory device 200 may be decreased, and problems such as decreased sensing margin due to leakage current in non-selected memory cells may be improved.

Figure 9:
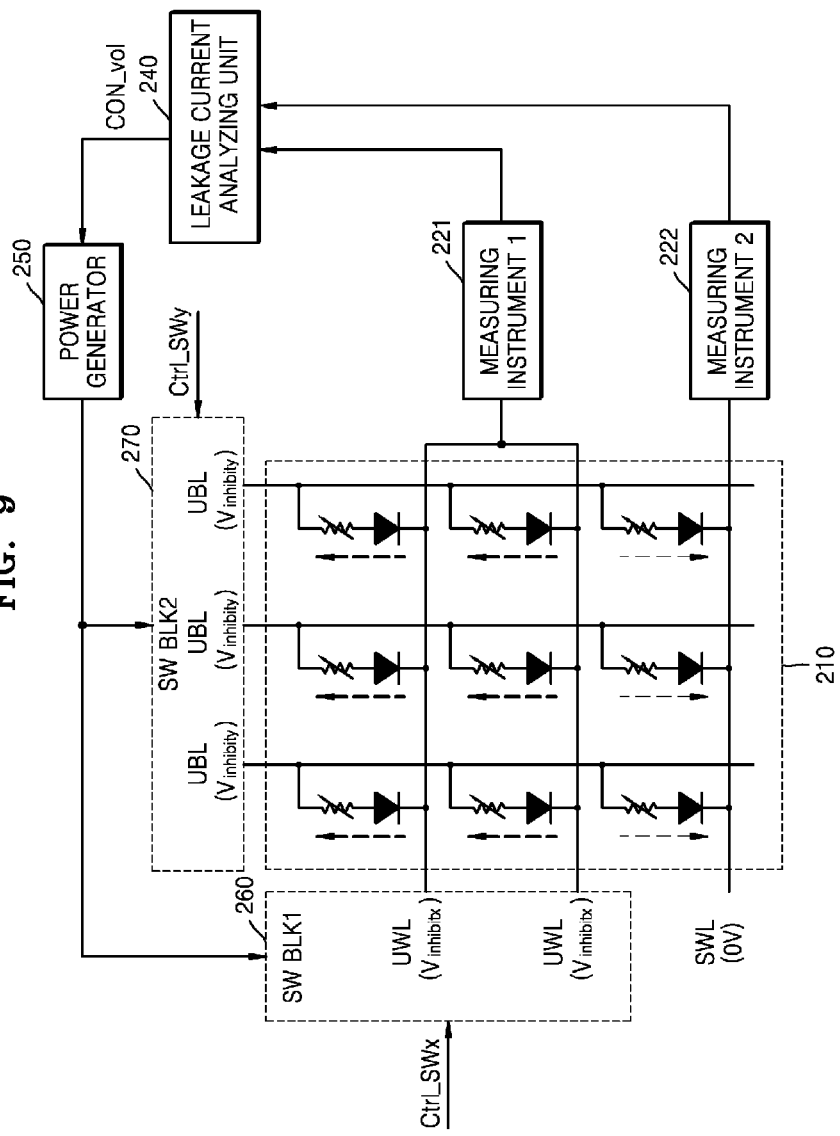
FIG. 9 is a circuit diagram illustrating operations of the memory device of FIG. 8 according to an embodiment of the inventive concept.

FIG. 9 is a circuit diagram further illustrating in one example the operation of the memory device 200 of FIG. 8 according to embodiments of the inventive concept. FIG. 9 illustrates leakage current measuring and analyzing operations with respect to leakage current occurring during a write operation. Referring to FIG. 9, 0V is applied to a selected word line SWL according to a set write operation, and a selected bitline and a selected memory cell are not shown.

According to various memory operations, levels of various inhibit voltages may be set. As illustrated in FIG. 9, according to a biasing condition of the set write operation, a forward leakage current may occur in some memory cells and a reverse leakage current may occur in other memory cells. For example, the forward leakage current may occur in memory cells that are connected to a selected word line SWL, and the reverse leakage current may occur in memory cells that are connected to non-selected wordlines UWL. The first measuring unit 220 of FIG. 8 may include a measuring instrument 1 221 and a measuring instrument 2 222. The measuring instrument 1 221 may be connected to the non-selected wordlines UWL and thus may measure the reverse leakage current. On the other hand, the measuring instrument 2 222 may be connected to the selected word line SWL and thus may measure the forward leakage current.

However, in the context of another memory operation, the measuring instrument 1 221 and the measuring instrument 2 222 may measure leakage currents in different directions, respectively. Alternatively, regardless of an memory operation, inhibit voltages having various levels may be provided to wordlines and bitlines during a particular mode, and in this case, each of the measuring instrument 1 221 and the measuring instrument 2 222 may measure a forward or reverse leakage current according to the levels of the inhibit voltages.

Measurement results from the measuring instrument 1 221 and the measuring instrument 2 222 may be provided to the leakage current analyzing unit 240. Then, the leakage current analyzing unit 240 may generate a control signal (CON_vol) according to the measurement results of the leakage currents and may provide the control signal to the power generator 250. The power generator 250 may adjust a level of a first inhibit voltage $V_{inhibitx}$ and a level of a second inhibit voltage $V_{inhibity}$ in response to the control signal.

The first inhibit voltage $V_{inhibitx}$ having an adjusted level may be provided to the memory cell array 210 via a first switching block 260, and the second inhibit voltage $V_{inhibity}$ having an adjusted level may be provided to the memory cell array 210 via a second switching block 270. The first switching block 260 may be controlled by a first switch control signal (ctrl_SWx) from a control logic. Also, the second switching block 270 may be controlled by a second switch control signal from the control logic. Although not illustrated, a voltage signal to the selected wordline SWL may be provided via a row decoder (not shown), and a voltage signal to a selected bitline may be provided via a write/read circuit.

Figures 10, 11A:
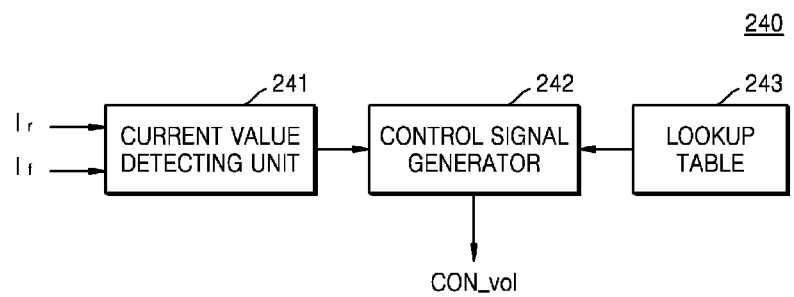
FIG. 10 is a block diagram of a leakage current analyzing unit of FIG. 8 according to an embodiment of the inventive concept.
FIGS. 11A and 11B are tables listing adjusting levels for inhibit voltages according to various conditions.

FIG. 10 is a block diagram further illustrating in one example the leakage current analyzing unit 240 of FIG. 8 according to an embodiment of the inventive concept. As illustrated in FIG. 10, the leakage current analyzing unit 240 may include a current value detecting unit 241, a control signal generator 242, and a lookup table 243.

The current value detecting unit 241 may receive leakage current measurement results (i.e., $I_r$ and $I_f$), and may detect current values, based on the leakage current measurement results. For example, the current value detecting unit 241 may detect values of forward leakage currents and values of reverse leakage currents, based on the leakage current measurement results. For example, the current value detecting unit 241 may determine measurement results from one or more detectors as measurement results of the forward leakage currents, may sum up the measurement results, and thus may detect the values of the forward leakage currents. Similarly, the current value detecting unit 241 may detect the values of the reverse leakage currents that occur in the memory cell array 210, and may provide the detection results to the control signal generator 242.

The lookup table 243 may store control information that corresponds to the detection results of the values. The control signal generator 242 may access the control information that corresponds to the detection results from the current value detecting unit 241 and are stored in the lookup table 243. Also, the control signal generator 242 may provide the power generator 250 with the control signal (CON_vol) that is an access result or information obtained by processing the access result.

Figures 11B, 12:
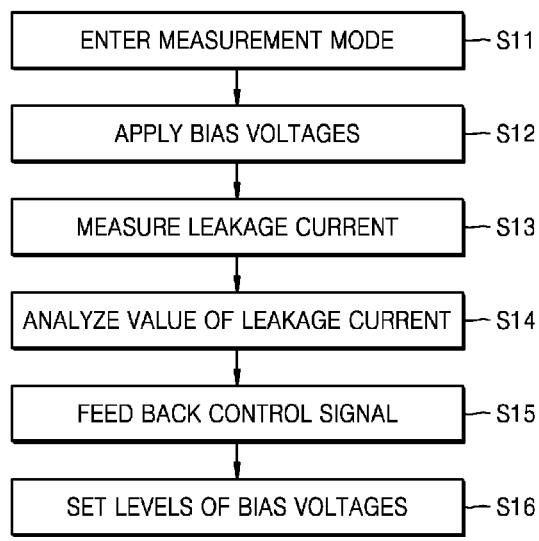
FIG. 12 is a flowchart summarizing an operating method for a memory device according to an embodiment of the inventive concept.

FIGS. 11A and 11B are respective table listing adjusting levels for inhibit voltages according to various conditions. Tables of FIGS. 11A and 11B are described with reference to FIG. 8.

As illustrated in FIG. 11A, when it is assumed that, in Case 1, a resistance value of a variable resistor (or a reset resistor) in a reset-state memory cell of the memory cell array 210 is decreased, a value of a forward leakage current that is measured via a wordline (or a bitline) connected to the reset-state memory cell may be increased. The leakage current analyzing unit 240 may output a control signal for adjusting levels of inhibit voltages, according to the measurement results. For example, in order to decrease a forward leakage current of the memory cell array 210, the leakage current analyzing unit 240 may output a control signal for adjusting the level of the first inhibit voltage $V_{inhibitx}$ and the level of the second inhibit voltage $V_{inhibity}$.

When it is assumed that, in Case 2, a resistance value of a variable resistor (or a set resistor) in a set-state memory cell of the memory cell array 210 is increased, a value of a forward leakage current that is measured via a wordline (or a bitline) connected to the set-state memory cell may be decreased. The leakage current analyzing unit 240 may output a control signal for adjusting levels of inhibit voltages, according to the measurement results. For example, in order to decrease a reverse leakage current of the memory cell array 210, the leakage current analyzing unit 240 may output a control signal for adjusting the level of the first inhibit voltage $V_{inhibitx}$ and the level of the second inhibit voltage $V_{inhibity}$.

When it is assumed that, in Case 3, a wear state (or "wear-out" condition) in a reset direction occurs in a memory cell, a large amount of reverse leakage current may occur due to an inhibit voltage via the memory cell. The sharp increase of the reverse leakage current may be provided as a measurement result to the leakage current analyzing unit 240, and then the leakage current analyzing unit 240 may output a control signal for adjusting the level of the first inhibit voltage $V_{inhibitx}$ and the level of the second inhibit voltage $V_{inhibity}$ and thus may decrease the reverse leakage current of the memory cell array 210.

FIG. 11B illustrates a table listing adjusted inhibit voltages according to leakage current as measured during a memory operation. As illustrated in FIG. 11B, when a forward leakage current $I_f$ is increased and a reverse leakage current $I_r$ is decreased according to a leakage current measurement result during a SET Write operation, a level of a first inhibit voltage $V_{inhibitx}$ may be increased and a level of a second inhibit voltage $V_{inhibity}$ may be decreased so as to decrease the forward leakage current $I_f$. On the other hand, when the forward leakage current $I_f$ is decreased and the reverse leakage current $I_r$ is increased, the level of the first inhibit voltage $V_{inhibitx}$ may be decreased and the level of the second inhibit voltage $V_{inhibity}$ may be increased so as to decrease the reverse leakage current $I_r$.

During a RESET Write operation, various leakage current measurement results may be obtained. For example, although the forward leakage current $I_f$ is increased in the RESET Write operation, the forward leakage current $I_f$ may not have a significant impact on a write operation and thus the level of the first inhibit voltage $V_{inhibitx}$ and the level of the second inhibit voltage $V_{inhibity}$ may not be adjusted. However, when the reverse leakage current $I_r$ is sharply increased due to the occurrence of the wear-out, in order to decrease the reverse leakage current $I_r$, the level of the first inhibit voltage $V_{inhibitx}$ may be decreased and the level of the second inhibit voltage $V_{inhibity}$ may be increased. According to a leakage current measurement result obtained during a READ operation, the level of the first inhibit voltage $V_{inhibitx}$ and the level of the second inhibit voltage $V_{inhibity}$ may be adjusted, for example, if the forward leakage current $I_f$ is increased, the level of the second inhibit voltage $V_{inhibity}$ may be decreased so as to decrease the forward leakage current $I_f$.

As will be appreciated by those skilled in the art, the examples presented in the tables of FIGS. 11A and 11B are just that; examples. The leakage current may variously occur and thus different measurement results may be obtained, and level adjustment of inhibit voltages based on the measurement results may be variously defined. For example, the level adjustment of the inhibit voltages may be differently performed on different memory operations such as a write operation, a read operation, etc.

FIG. 12 is a flowchart summarizing an operating method for a memory device according to an embodiment of the inventive concept.

In accordance with various operating modes for a memory device, leakage current measuring and analyzing operations may be performed on a leakage current, and the memory device may enter a "measurement mode" with respect to the leakage current according to a preset operating environment (S11). For example, as described above, the memory device may measure leakage current during a test mode executed during a power-up period. Alternately, the memory device may measure leakage current periodically or occasionally measure the leakage current during a memory operation in response to an initiating event.

In order to measure leakage current that occurs in a memory cell array, various bias control voltages may be applied to the memory cell array (S12). The bias control voltages may include inhibit voltages and may have levels according to a predefined biasing condition of a write operation or a read operation. Alternatively, the bias control voltages may have randomly set levels for adjusting leakage currents, for example, the levels may be randomly set to allow some measuring instruments to measure a forward leakage current and to allow other measuring instruments to measure a reverse leakage current. Due to the applied bias control voltages, leakage current occurs in the memory cell array, and the measuring operation is performed on the leakage current (S13). According to the measurement result, the analyzing operation may be performed on a value of the leakage current (S14), and a control signal according to the analysis result may be fed back to a power generator (S15).

The power generator may provide the memory cell array with bias control voltages having appropriately adjusted levels as defined by the control signal. After the aforementioned test procedure, a biasing condition for generating an optimal leakage current may be detected, and the levels of the bias control voltages according to the biasing condition may be set and stored in the memory device (S16).

According to the bias control voltages set in the aforementioned manner, inhibit voltages having adjusted levels may be provided to the memory cell array during a next normal memory operation. As in the one or more embodiments described above, detecting and analyzing operations with respect to leakage current may be performed during a normal memory operation, and in this case, the power generator may provide, in response to the control signal according to the analysis result, the inhibit voltages having the adjusted levels to the memory cell array.

Figure 13:
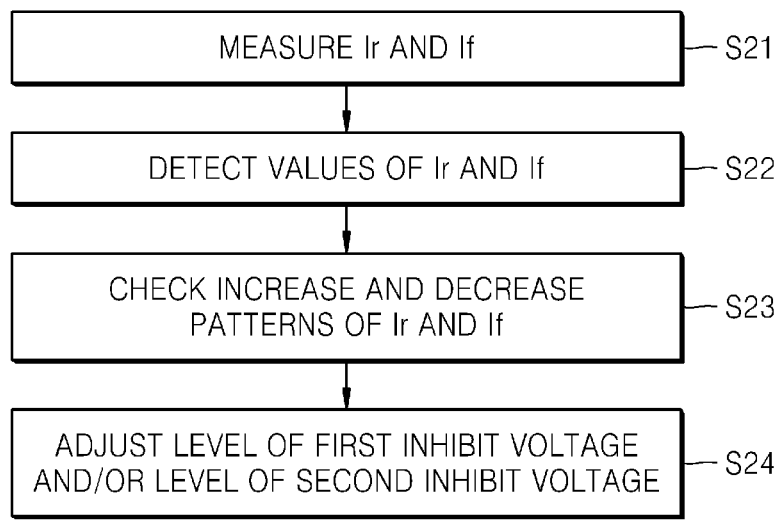
FIG. 13 is a flowchart summarizing the leakage current measuring and analyzing steps of the method illustrated in FIG. 12 according to an embodiment of the inventive concept.

FIG. 13 is a flowchart further summarizing in one example the leakage current measuring and analyzing operations of the method described in FIG. 12 according to an embodiment of the inventive concept.

As illustrated in FIG. 13, since various inhibit voltages are applied to a memory cell array, a forward leakage current flows in some memory cells of the memory cell array, and a reverse leakage current flows in other memory cells of the memory cell array. The memory may device include one or more measuring instruments to measure currents, and in this regard, some measuring instruments may measure a forward leakage current $I_f$ and other measuring instruments may measure a reverse leakage current $I_r$ (S21).

The analyzing operation may be performed on the measured leakage currents (i.e., $I_f$ and $I_r$), for example, a value of each of the measured leakage currents may be detected based on the measurement results of the leakage currents (i.e., $I_f$ and $I_r$) (S22). For example, values of all of the forward leakage currents $I_f$ or values of all of the reverse leakage currents $I_r$ that occur in the memory cell array may be detected. When the values are detected, increase and decrease patterns for the leakage currents (i.e., $I_f$ and $I_r$) may be checked (S23). For example, the memory device may check in which direction of the memory cell array the leakage current greatly occurs, according to levels of the values of the forward leakage current $I_f$ and the reverse leakage current $I_r$. Alternatively, an amplitude of the forward leakage current $I_f$ and/or an amplitude of the reverse leakage current $I_r$ may be changed according to temperature variation or a change in characteristics of a variable resistor and a selection device of the memory device, and the memory device may check, according to the measurement results of the values, in which direction the value of the leakage current is increased.

According to the check result of the leakage currents (i.e., $I_f$ and $I_r$), at least one bias control voltages may be adjusted, e.g., a level of an inhibit voltage may be adjusted (S24). When a first inhibit voltage is provided to wordlines of the memory cell array, and a second inhibit voltage is provided to bitlines of the memory cell array, a level of at least one of the first and second inhibit voltages may be adjusted. According to the check result, if the value of the forward leakage current $I_f$ is increased, the level of the inhibit voltage may be adjusted to decrease the forward leakage current $I_f$. Alternatively, if the value of the reverse leakage current $I_r$ is increased, the level of the inhibit voltage may be adjusted to decrease the reverse leakage current $I_r$.

Figure 14:
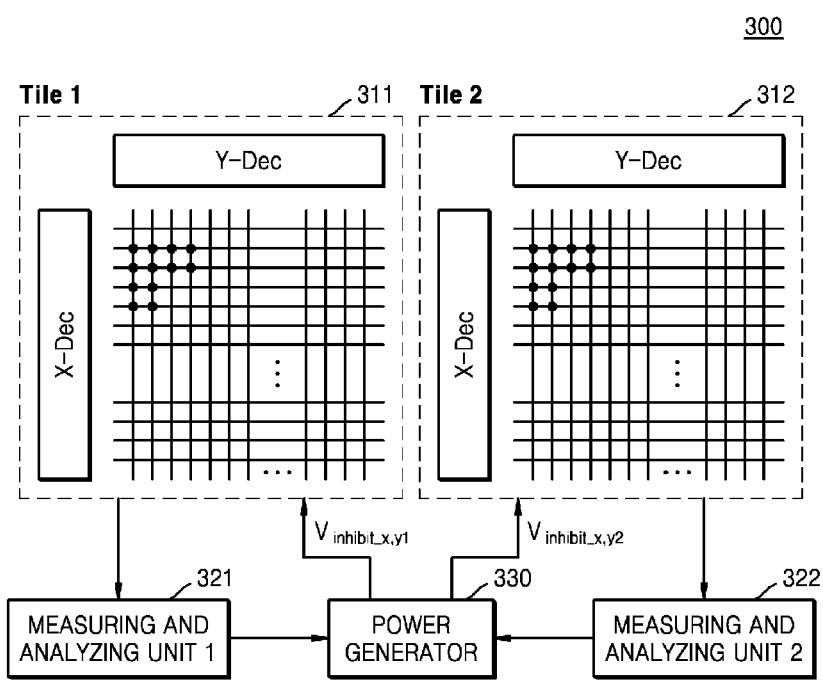
FIG. 14 is a block diagram of a memory device according to another embodiment of the inventive concept.

FIG. 14 is a block diagram illustrating a memory device 300 according to another embodiment of the inventive concept.

As illustrated in FIG. 14, the memory device 300 comprises a memory cell array, measuring and analyzing units 1 321 and 2 322, and a power generator 330. The memory cell array includes a plurality of memory cell areas, and in the embodiment of FIG. 14, the memory cells are grouped in a first tile 311 and a second tile 312. A "tile" may be variously defined (e.g., the tile may be defined as a unit including memory cells at intersections of wordlines that are commonly connected to one row decoder, or bitlines that are commonly connected to one column decoder). Although not illustrated in FIG. 14, the write/read circuit 120, control logic 130, etc. that are peripheral circuits of the memory device 100 shown in FIG. 2 may be further arranged in the memory device 300.

The leakage current measuring and analyzing operations for the memory device 30 of FIG. 14 may be performed on a tile unit by tile unit basis. For example, the measuring and analyzing unit 1 321 may be connected to wordlines and/or bitlines of the first tile 311 and thus may measure a leakage current that flows in memory cells of the first tile 311, and then may provide the power generator 330 with a control signal based on an analysis result with respect to the measurement. Similarly, the measuring and analyzing unit 2 322 may be connected to wordlines and/or bitlines of the second tile 312 and thus may measure a leakage current that flows in memory cells of the second tile 312, and then may provide the power generator 330 with a control signal based on an analysis result with respect to the measurement. The power generator 330 may adjust, based on the control signals, levels of inhibit voltages to be provided to the first and second tiles 311 and 312, respectively. That is, the power generator 330 may provide the first tile 311 with first and second inhibit voltages $V_{inhibitx,y1}$ of which levels are adjusted for the first tile 311, or may provide the second tile 312 with first and second inhibit voltages $V_{inhibitx,y2}$ of which levels are adjusted for the second tile 312.

The first tile 311 and the second tile 312 may be exhibit different memory cell operating characteristics. For example, characteristics of variable resistors, selection devices, etc. of memory cells of the first tile 311 and characteristics of variable resistors, selection devices, etc. of memory cells of the second tile 312 may be differently changed, thus, even when a bias control voltage is equally applied to the first tile 311 and the second tile 312, leakage currents having different levels may occur. Therefore, according to the analysis result with respect to the leakage current of each of the first tile 311 and the second tile 312, the levels of the first and second inhibit voltages $V_{inhibitx,y1}$ for the first tile 311 may be different from the levels of the first and second inhibit voltages $V_{inhibitx,y2}$ for the second tile 312.

Figure 15:
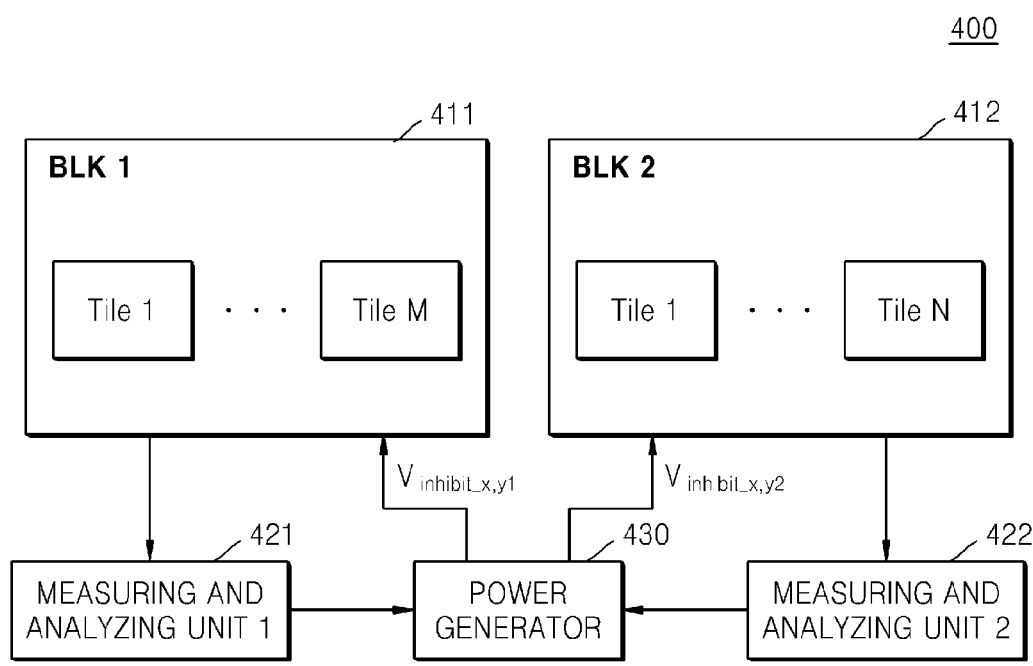
FIG. 15 is a block diagram of a memory device according to another embodiment of the inventive concept.

FIG. 15 is a block diagram illustrating a memory device 400 according to another embodiment of the inventive concept. Referring to FIG. 15, the constituent memory cell array is assumed to include a plurality of blocks, wherein each block includes a plurality of tiles. Here, a leakage current compensating operation may be performed on a block unit basis.

As illustrated in FIG. 15, the memory device 400 includes the memory cell array, measuring and analyzing units 1 421 and 2 422, and a power generator 430. The memory cell array may include the plurality of blocks, and in the embodiment of FIG. 15, the memory cell array includes a first block 411 and a second block 412. Each of the blocks may include a plurality of tiles, e.g., the first block 411 includes M tiles and the second block 412 includes N tiles.

The leakage current measuring and analyzing operations in the one or more embodiments may be performed by a block unit. The measuring and analyzing unit 1 421 may measure leakage currents that flow in memory cells of the first block 411 and may provide the power generator 430 with a control signal based on an analysis result of the measurement. For example, the measuring and analyzing unit 1 421 may measure leakage currents of one or more tiles and may provide the power generator 430 with a control signal based on measurement and analysis results. The power generator 430 may provide first and second inhibit voltages $V_{inhibitx,y1}$ for the first block 411 to the first block 411, so that the first and second inhibit voltages $V_{inhibitx,y1}$ having same level may be provided to tiles included in the first block 411.

Similarly, the measuring and analyzing unit 2 422 may measure leakage currents that flow in memory cells of the second block 412 and may provide the power generator 430 with a control signal based on an analysis result of the measurement. The control signal based on the analysis result with respect to the leakage currents may be provided from the measuring and analyzing unit 2 422 to the power generator 430, so that first and second inhibit voltages $V_{inhibitx,y2}$ having same level may be provided to tiles included in the second block 412. The present embodiment may be variously modified, e.g., the leakage current measuring and analyzing operations may be performed by a bank unit including a plurality of blocks. Alternatively, one tile may be divided into at least two cell regions, and the leakage current measuring and analyzing operations may be performed by a unit of each cell region. Alternatively, when the leakage current measuring and analyzing operations are performed by a wordline unit or a bitline unit, a level of an inhibit voltage may be adjusted by the wordline unit or the bitline unit.

Figure 16:
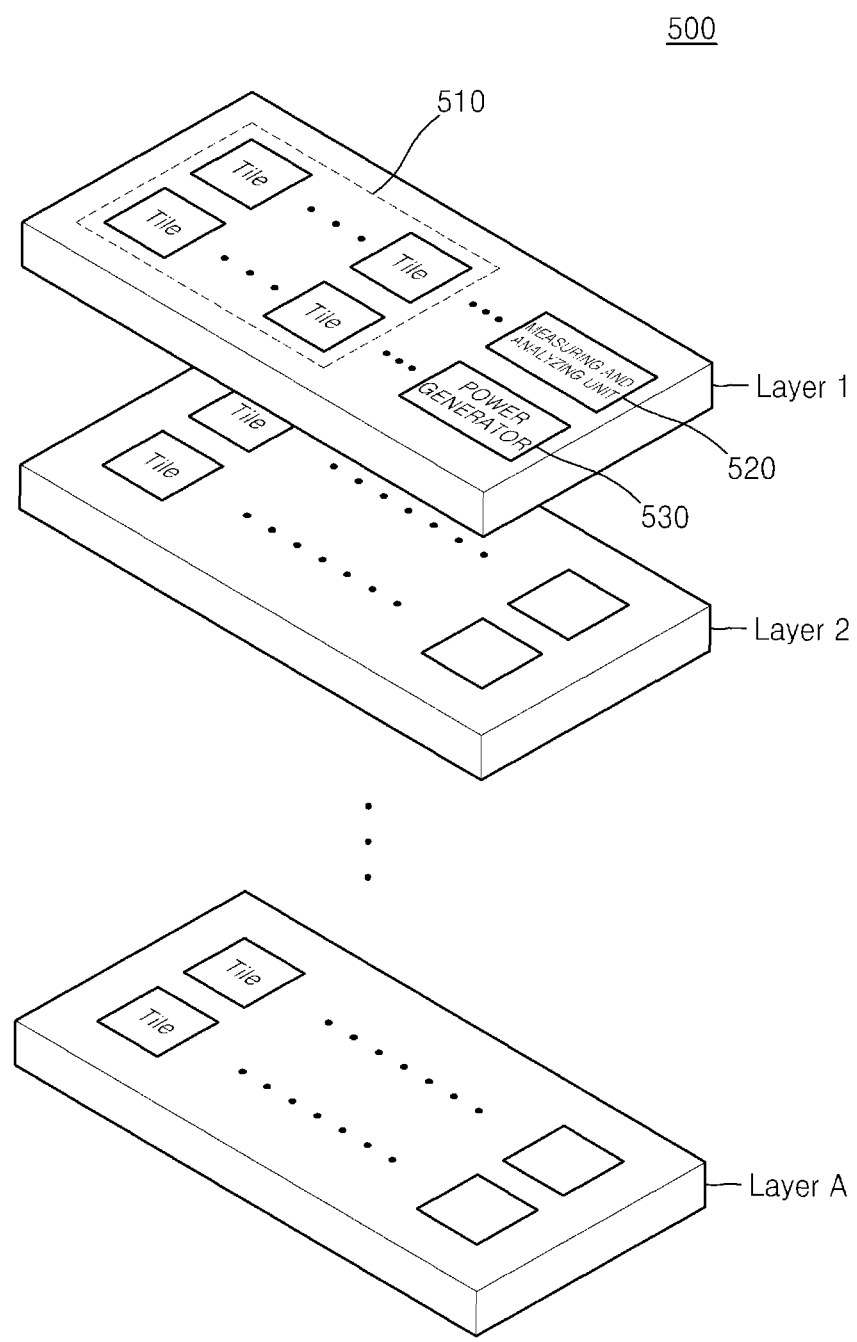
FIGS. 16 and 17 are block diagrams of memory devices according to embodiments of the inventive concept.
Figure 17:
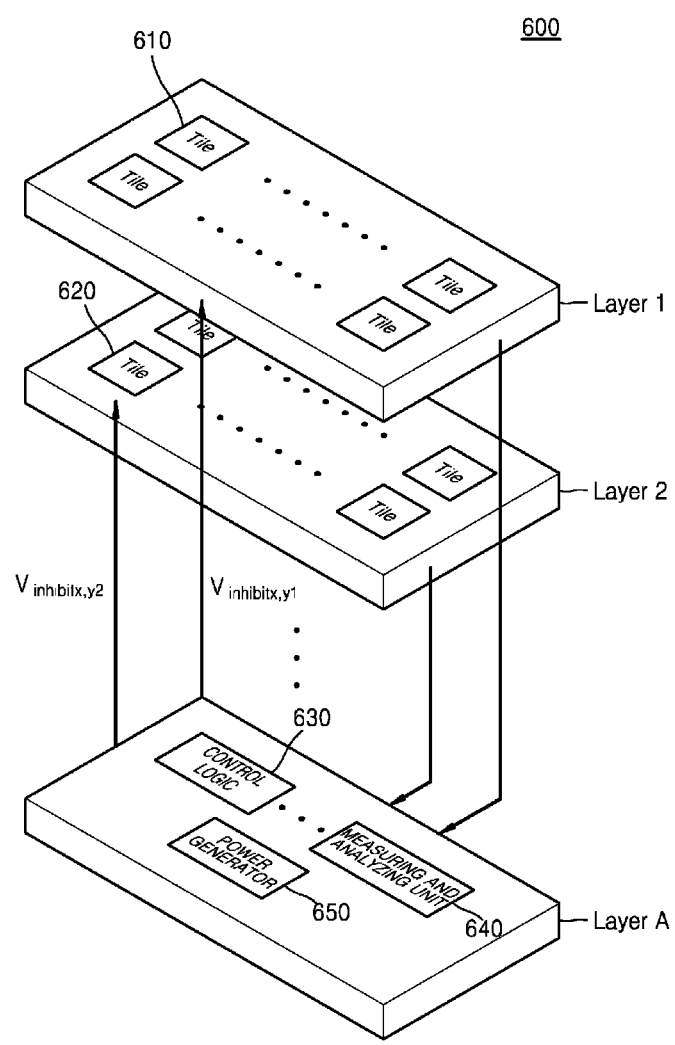

FIGS. 16 and 17 are perspective views respectively illustrating memory devices 500 and 600 according to various embodiments of the inventive concept. In the embodiments of FIGS. 16 and 17, each of the memory devices 500 and 600 includes a plurality of layers (e.g., Layer 1 through Layer A), each of which including a plurality of tiles.

As illustrated in FIG. 16, the memory device 500 includes Layer 1 through Layer A that respectively include units for performing leakage current measuring and analyzing operations. For example, Layer 1 includes a memory cell array 510, a measuring and analyzing unit 520, and a power generator 530. The memory cell array 510 may include a plurality of cell regions, e.g., a plurality of tiles. The measuring and analyzing unit 520 may perform the leakage current measuring and analyzing operations according to the one or more embodiments, and may provide a control signal based on an analysis result to the power generator 530. In response to the control signal, the power generator 530 may generate inhibit voltages of which levels are adjusted and may provide the inhibit voltages to the memory cell array 510.

As illustrated in FIG. 17, the memory device 600 is also assumed to include Layer 1 through Layer A. Some of Layer 1 through Layer A may be memory layers including memory cells, and the other layers may be control layers including control circuits. In the embodiment of FIG. 17, an $A_{th}$ layer (hereinafter, Layer A) corresponds to the control layer, and the other layers correspond to the memory layers. Layer A may be used to control memory operations with respect to the memory layers, and may receive read data from the memory layers.

Layer A, as the control layer, may include a control logic 630, a measuring and analyzing unit 640, and a power generator 650. The control logic 630 may control write and read operations with respect to the memory layers. Layer A may measure and analyze a leakage current that occurs in a memory cell array arranged in each of the memory layers, and may adjust levels of inhibit voltages that are provided to the memory layers, respectively. For example, the measuring and analyzing unit 640 may measure and analyze a leakage current of the first memory cell array 610 included in Layer 1, and the power generator 650 may provide first and second inhibit voltages $V_{inhibitx,y1}$ for Layer 1 to the Layer 1, according to an analysis result. Also, the measuring and analyzing unit 640 may measure and analyze leakage current of the second memory cell array 620 included in the Layer 2, and the power generator 650 may provide first and second inhibit voltages $V_{inhibitx,y2}$ to Layer 2 according to an analysis result.

Figure 18:
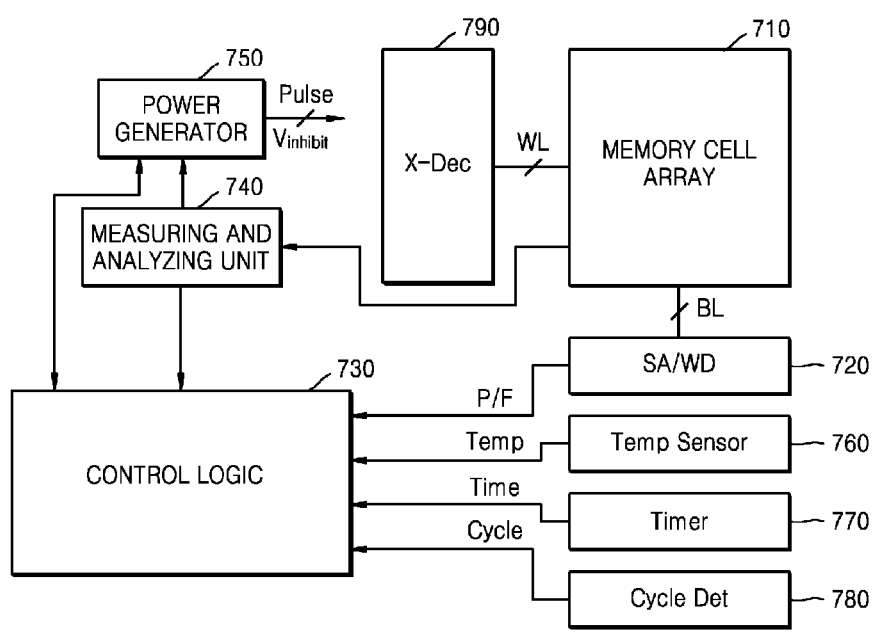
FIG. 18 is a block diagram of a memory device according to another embodiment of the inventive concept.

FIG. 18 is a block diagram illustrating a memory device 700 according to another embodiment of the inventive concept.

Referring to FIG. 18, the memory device 700 comprises a memory cell array 710, a write/read circuit 720, a control logic 730, a measuring and analyzing unit 740, a power generator 750, and a row decoder 790. Also, the memory device 700 may further include a temperature sensor 760, a timer 770, and a cycle detector 780.

The measuring and analyzing unit 740 may be connected to at least one wordline and/or at least one bitline of the memory cell array 710, and may measure and analyze, according to a control by the control logic 730, a leakage current that occurs in the memory cell array 710. When a control signal based on the analysis result of the leakage current is provided to the power generator 750, levels of inhibit voltages that are provided to the memory cell array 710 may be adjusted.

The control logic 730 may receive signals from various functional blocks arranged in the memory device 700, and may control leakage current measuring and analyzing operations to be performed based on the signals. For example, the leakage current measuring and analyzing operations may be performed during a power-up period of the memory device 700, and the control logic 730 may detect levels of one or more voltage signals that are generated by the power generator 750 and thus may control the leakage current measuring and analyzing operations to be performed. Also, according to a pass/fail signal P/F from the write/read circuit 720, when the control logic 730 determines that the number of data errors exceeds a reference value, the control logic 730 may control the leakage current measuring and analyzing operations to be performed. Also, according to time information Time from the timer 770, the control logic 730 may control the leakage current measuring and analyzing operations to be performed. Alternatively, according to cycle information Cycle from the cycle detector 780, the control logic 730 may control the leakage current measuring and analyzing operations to be performed in every predetermined write cycle or read cycle.

Figure 19:
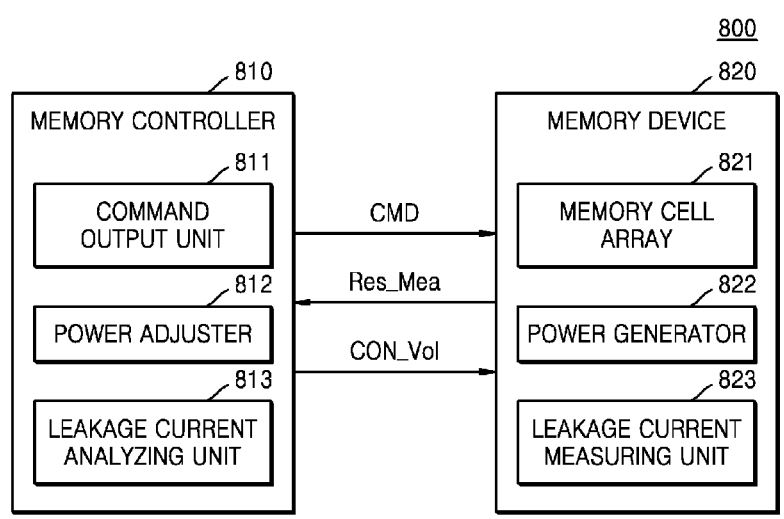
FIG. 19 is a block diagram of a memory system according to an embodiment of the inventive concept.

FIG. 19 is a block diagram illustrating a memory system 800 according to an embodiment of the inventive concept.

Referring to FIG. 19, the memory system 800 generally comprises a memory controller 810 and a memory device 820. The memory controller 810 may include a command output unit 811, a power adjuster 812, and a leakage current analyzing unit 813. The memory device 820 may include a memory cell array 821, a power generator 822, and a leakage current measuring unit 823. Although not illustrated in FIG. 19, the memory device 820 may further include the write/read circuit and the control logic as peripheral circuits for memory operations including read and write operations.

The leakage current measuring unit 823 may measure a leakage current that occurs in the memory cell array 821. For example, the leakage current measuring unit 823 may be connected to one or more wordlines and/or one or more bitlines and may measure leakage currents via the wordlines and/or bitlines. The leakage current measurement result Res_Mea may be provided to the memory controller 810.

The command output unit 811 may provide a command CMD for requesting a memory operation to the memory device 820. Also, the power adjuster 812 may provide a control signal (CON_vol) to the memory device 820 so as to adjust various voltages that are used in the memory device 820. The leakage current analyzing unit 813 may perform the leakage current analyzing operation according to the one or more embodiments, and may provide an analysis result to the power adjuster 812. The power adjuster 812 may provide the memory device 820 with the control signal that corresponds to the analysis result from the leakage current analyzing unit 813.

In the embodiment illustrated in FIG. 19, the leakage current measuring operation may be performed by the leakage current measuring unit 823 that is connected to wordlines and/or bitlines of the memory cell array 821. Also, the leakage current analyzing unit 813 may perform the leakage current analyzing operation by using the measurement result and may output, based on the analysis result, control information for adjusting levels of one or more inhibit voltages. The power generator 822 may provide the memory cell array 821 with the inhibit voltages of which levels are adjusted based on the control signal from the memory controller 810, so that the leakage current that occurs in the memory cell array 821 may be managed.

Figure 20:
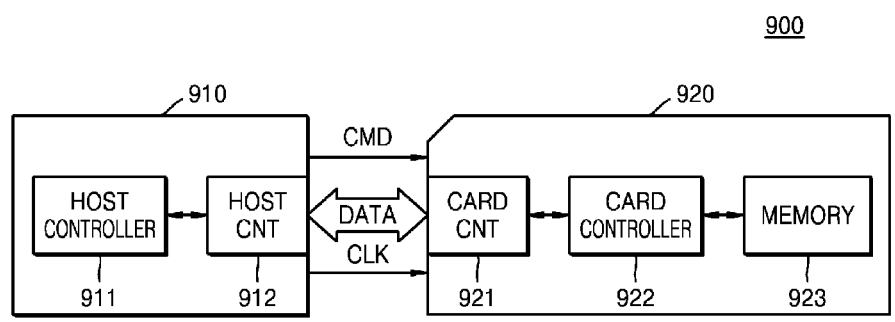
FIG. 20 is a block diagram of a memory card system that may incorporate a resistive memory system according to an embodiment of the inventive concept.

FIG. 20 is a block diagram illustrating a memory card system 900 that may incorporate a resistive memory system according to an embodiment of the inventive concept.

Referring to FIG. 20, the memory card system 900 may include a host 910 and a memory card 920. The host 910 may include a host controller 911 and a host connector 912. The memory card 920 may include a card connector 921, a card controller 922, and a memory device 923. Here, the memory device 923 may be embodied by using one of the embodiments shown in FIGS. 1 through 19, so that the memory device 923 may include units for measuring and analyzing a leakage current and may adjust, according to an analysis result of the leakage current, levels of various inhibit voltages that are provided to a memory cell array that is arranged in the memory device 923.

The host 910 may write data to the memory card 920 or may read data stored in the memory card 920. The host controller 911 may transmit a command CMD, a clock signal CLK generated by a clock generator (not shown) in the host 910, and data DATA to the memory card 920 via the host connector 912.

In response to the command CMD received via the card connector 921, the card controller 922 may store the data DATA in the memory device 923, in synchronization with a clock signal that is generated by a clock generator (not shown) in the card controller 922. The memory device 923 may store the data DATA that is transmitted from the host 910.

The memory card 920 may be embodied as a CFC, a microdrive, an SMC, an MMC, a Security Digital Card (SDC), a memory stick, or a USB flash memory drive.

Figure 21:
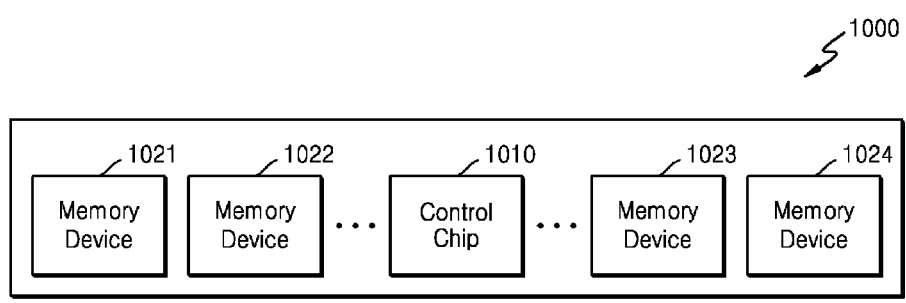
FIG. 21 illustrates a resistive memory module according to an embodiment of the inventive concept.

FIG. 21 illustrates a resistive memory module 1000, according to an embodiment of the inventive concept. Referring to FIG. 21, the resistive memory module 1000 may include memory devices 1021 through 1024, and a control chip 1010. Each of the memory devices 1021 through 1024 may be embodied by using one of the embodiments shown in FIGS. 1 through 19. In response to various signals transmitted by an external memory controller, the control chip 1010 may control the memory devices 1021 through 1024. For example, according to various commands and addresses that are transmitted from an external source, the control chip 1010 may activate the memory devices 1021 through 1024 corresponding to the various commands and addresses and thus may control write and read operations. Also, the control chip 1010 may perform various post processing operations on read data that is output from each of the memory devices 1021 through 1024, e.g., the control chip 1010 may perform error detection and correction operations on the read data.

In the present embodiment, each of the memory devices 1021 through 1024 may include units for measuring and analyzing a leakage current and may adjust, according to an analysis result of the leakage current, levels of various inhibit voltages that are provided to a memory cell array that is arranged in each of the memory devices 1021 through 1024.

Figure 22:
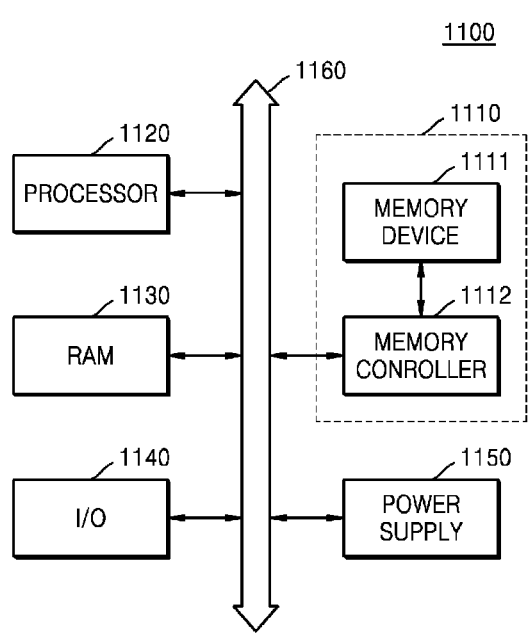
FIG. 22 is a block diagram of a computing system including a resistive memory system according to an embodiment of the inventive concept.

FIG. 22 is a block diagram illustrating a computing system 1100 including a resistive memory system according to an embodiment of the inventive concept.

Referring to FIG. 22, the computing system 1100 may include a memory system 1110, a processor 1120, a RAM 1130, an input/output (I/O) device 1140, and a power supply device 1150. The memory system 1110 may include a memory device 1111 and a memory controller 1122. Although not illustrated in FIG. 22, the computing system 1100 may further include ports for communication with a video card, a sound card, a memory card, or a USB device, or other electronic devices. The computing system 1100 may be embodied as a PC, or a portable electronic device such as a notebook computer, a mobile phone, a personal digital assistant (PDA), or a camera.

The processor 1120 may perform particular calculations or tasks. In the present embodiment, the processor 1120 may be a micro-processor, a Central Processing Unit (CPU), or the like. The processor 1120 may perform communication with the RAM 1130, the I/O device 1140, and the memory system 1110 via a bus 1160 such as an address bus, a control bus, or a data bus. Here, the memory system 1110 and/or the RAM 1130 may be embodied by using the memory device of one of the embodiments shown in FIGS. 1 through 19.

In the present embodiment, the processor 1120 may also be connected to an extended bus such as a Peripheral Component Interconnect (PCI) bus.

The RAM 1130 may store data for operations of the computing system 1100. As described above, the memory device according to the one or more embodiments of the inventive concept may be applied to the RAM 1130. Alternatively, a DRAM, a mobile DRAM, an SRAM, a PRAM, an FRAM, or an MRAM may be used as the RAM 1130.

The I/O device 1140 may include an input unit such as a keyboard, a keypad, or a mouse, and an output unit such as a printer or a display. The power supply device 1150 may supply an operating voltage for the operations of the computing system 1100.

While the inventive concept has been particularly shown and described with reference to exemplary embodiments thereof, it will be understood that various changes in form and details may be made therein without departing from the scope of the following claims.

What is claimed is:

1. An operating method for a resistive memory device, the method comprising:
applying a bias control voltage to a memory cell array of the resistive memory device;
measuring leakage current that occurs in the memory cell array in response to the applied bias control voltage to generate a measuring result;
generating a control signal based on the measuring result; and
adjusting a level of the bias control voltage in response to the control signal.

2. The method of claim 1, further comprising:
storing control information associated with the adjusting of the level of the bias control voltage.

3. The method of claim 1, further comprising:
entering a test mode during a power-up period for the resistive memory device, wherein the applying of the bias control voltage, the measuring of the leakage current, the generating of the control signal, and the adjusting of the level of the bias control voltage are performed during the test mode.

4. The method of claim 1, further comprising:
entering a normal mode for the resistive memory device during which normal memory operations may be performed,
wherein the applying of the bias control voltage, the measuring of the leakage current, the generating of the control signal, and the adjusting of the level of the bias control voltage are performed during the normal mode.

5. The method of claim 1, wherein the measuring of the leakage current comprises:
measuring a forward leakage current using a measuring instrument connected to a wordline of the memory cell array; and
measuring a reverse leakage current using a measuring instrument connected to a bitline of the memory cell array.

6. The method of claim 5, wherein the generating of the control signal comprises generating the control signal in response to an analysis of values of the forward leakage current and the reverse leakage current.

7. The method of claim 6, wherein the generating of the control signal comprises generating the control signal based on an analysis of increase and decrease patterns for the forward leakage current and the reverse leakage current.

8. The method of claim 7, wherein the adjusting of the level of the bias control voltage comprises adjusting a level of an inhibit voltage according to at least one of the values of the forward leakage current and the reverse leakage current.

9. The method of claim 5, wherein the generating of the control signal comprises accessing a lookup table listing control information corresponding to the forward leakage current and the reverse leakage current.

10. The method of claim 1, wherein the applying of the bias control voltage comprises applying a plurality of inhibit voltages to the memory cell array, wherein each one of the plurality of inhibit voltages has a level that is randomly set.

11. The operating method of claim 1, wherein the applying of the bias control voltage comprises applying a plurality of inhibit voltages to the memory cell array, wherein each one of the plurality of inhibit voltages has a level that is set in accordance with a memory operation.

12. The operating method of claim 1, wherein the memory cell array comprises a plurality of memory cell regions,
- the measuring of the leakage current comprises measuring leakage current for each one of the plurality of memory cell regions to generate measuring results for each one of the plurality of memory cell regions,
- the generating of the control signal based on the measuring result comprises generating a plurality of control signals based respectively on the measuring results for each one of the plurality of memory cell regions,
- the bias control voltage comprises a plurality of inhibit voltages, and adjusting the level of the bias control voltage comprises respectively adjusting levels of the plurality of inhibit voltages in response to a corresponding one of the plurality of control signals.

13. The operating method of claim 1, wherein the memory cell array comprises a wordlines and bitlines,
- the bias control signal comprises first and second inhibit voltages, wherein a level of the first inhibit voltage provided to at least one of the wordlines is adjusted in response to the control signal, and a level of the second inhibit voltage provided to at least one of the bitlines is adjusted in response to the control signal.

* * * * *